(12) United States Patent
Yu et al.

(10) Patent No.: US 11,528,006 B2
(45) Date of Patent: Dec. 13, 2022

(54) BAW RESONANCE DEVICE, FILTER DEVICE AND RF FRONT-END DEVICE

(71) Applicant: SHENZHEN SUNWAY COMMUNICATION CO., LTD., Guangdong (CN)

(72) Inventors: Chengcheng Yu, Shenzhen (CN); Yanjie Cao, Shenzhen (CN); Wei Wang, Shenzhen (CN)

(73) Assignee: SHENZHEN SUNWAY COMMUNICATION CO., LTD., Guangdong (CN)

(*) Notice: Subject to any disclaimer, the term of this patent is extended or adjusted under 35 U.S.C. 154(b) by 154 days.

(21) Appl. No.: 17/018,686

(22) Filed: Sep. 11, 2020

(65) Prior Publication Data

US 2021/0399713 A1 Dec. 23, 2021

Related U.S. Application Data

(63) Continuation of application No. PCT/CN2020/102913, filed on Jul. 20, 2020.

(30) Foreign Application Priority Data

Jun. 22, 2020 (CN) .......................... 202010575797.3

(51) Int. Cl.
*H03H 9/13* (2006.01)
*H03H 9/02* (2006.01)
(Continued)

(52) U.S. Cl.
CPC ............... *H03H 9/131* (2013.01); *H03F 3/21* (2013.01); *H03H 9/02031* (2013.01);
(Continued)

(58) Field of Classification Search
CPC .... H03H 9/131; H03H 9/02031; H03H 9/173; H03H 9/176; H03H 9/562; H03H 9/564;
(Continued)

(56) References Cited

U.S. PATENT DOCUMENTS 7,463,117 B2 * 12/2008 Ohara ..................... H03H 9/703
333/187
2015/0295559 A1 * 10/2015 White .................... H03H 9/542
333/133
(Continued)

*Primary Examiner* — Hafizur Rahman
(74) *Attorney, Agent, or Firm* — Oliff PLC

(57) ABSTRACT

A BAW resonance device comprises a first layer including a cavity located on a first side, a first electrode having a first end located in the cavity and a second end contacting with the first layer, a second layer located on the first side, and a second electrode located on the second layer above the cavity, wherein the first electrode and the second electrode are located on two sides of the second layer. The first electrode comprises a first electrode layer and a second electrode layer, and the second electrode layer and the second layer are located on two sides of the first electrode layer. The second electrode comprises a third electrode layer and a fourth electrode layer, and the second layer and the fourth electrode layer are located on two sides of the third electrode layer. Thus, the electrical resistance is lowered and the electrical losses are reduced.

52 Claims, 7 Drawing Sheets

(51) Int. Cl.
    *H03H 9/17*    (2006.01)
    *H03H 9/56*    (2006.01)
    *H03H 9/70*    (2006.01)
    *H03F 3/21*    (2006.01)

(52) U.S. Cl.
    CPC ............ *H03H 9/173* (2013.01); *H03H 9/176* (2013.01); *H03H 9/562* (2013.01); *H03H 9/564* (2013.01); *H03H 9/703* (2013.01); *H03F 2200/165* (2013.01); *H03F 2200/294* (2013.01); *H03F 2200/451* (2013.01)

(58) Field of Classification Search
    CPC ..... H03H 9/703; H03F 3/21; H03F 2200/165; H03F 2200/294; H03F 2200/451
    USPC .......................................................... 330/302
    See application file for complete search history.

(56) References Cited

U.S. PATENT DOCUMENTS

2017/0214387 A1\* 7/2017 Burak ...................... H03H 3/04
2018/0287584 A1\* 10/2018 Azarnaminy ...... H03H 9/02125
2019/0326873 A1\* 10/2019 Bradley ............. H03H 9/02015

\* cited by examiner

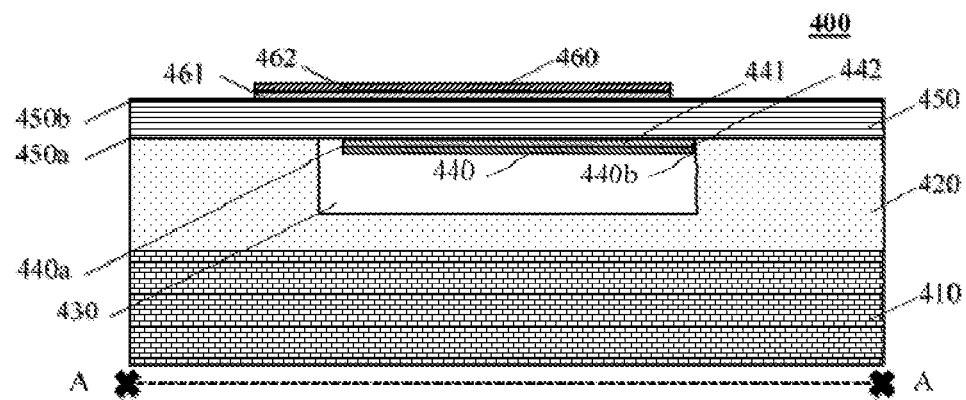
FIG. 4a
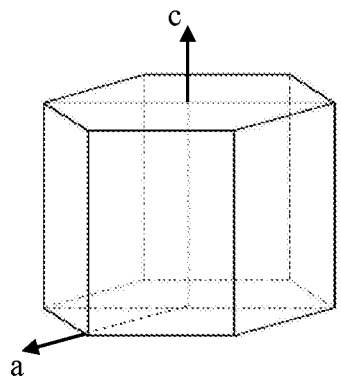
FIG. 4b
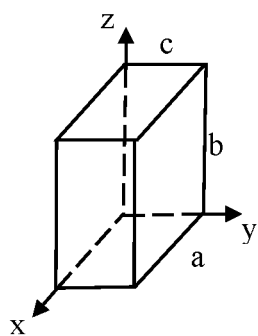     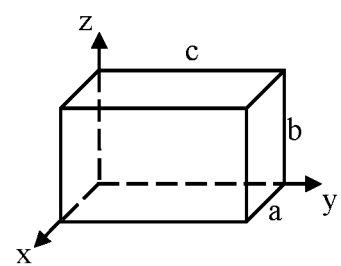     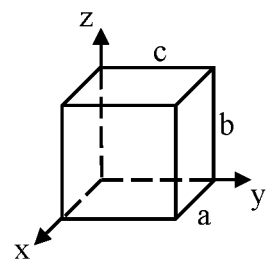
FIG. 4c (i)          FIG. 4c (ii)          FIG. 4c (iii)

BAW RESONANCE DEVICE, FILTER DEVICE AND RF FRONT-END DEVICE

TECHNICAL FIELD

The invention relates to the technical field of semiconductors, in particular to a BAW resonance device, a filter device and an RF front-end device.

DESCRIPTION OF RELATED ART

The radio frequency (RF) front-end chip of wireless communication equipment includes a power amplifier, an antenna switch, an RF filter, a multiplexer, a low-noise amplifier, and the like, wherein the RF filter is a surface acoustic wave (SAW) filter, a bulk acoustic wave (BAW) filter, a micro-electro-mechanical system (MEMS) filter, an integrated passive devices (IPD) filter, or the like.

SAW resonators and BAW resonators have a high quality factor value (Q value) and are used to manufacture RF filters with a low insertion loss and a high-out-of-band rejection, namely SAW filters and BAW filters which are mainstream RF filters applied to wireless communication equipment such as mobile phones and base stations at present. Wherein, Q value refers to the quality factor value of the resonators and is defined as a value obtained by dividing the center frequency by 3 dB bandwidth of the resonators. The operating frequency of the SAW filers is generally 0.4 GHz-2.7 GHz, and the operating frequency of the BAW filters is 0.7 GHz-7 GHz.

The BAW resonators have better performance than the SAW resonators. However, because of the complicated process steps, the manufacturing cost of the BAW resonators is higher than that of the SAW resonators. The gradual evolution of the wireless communication technology leads to the usage of more and more frequency bands, and the application of frequency band superposition technologies, such as the carrier aggregation technology, results in severer and severer mutual interference between different wireless frequency bands. High-performance BAW technologies can solve the problem of mutual interference between different frequency bands. Along with the rise of 5G, higher communication frequency bands have been introduced into wireless mobile networks, and the BAW technique is the unique technique that can fulfill high-frequency filtering at present.

FIG. 1 illustrates a BAW filter 100 which includes a ladder circuit formed by multiple BAW resonators, wherein f1, f2, f3 and f4 respectively represent four different frequencies. In each BAW resonator, metals on two sides of a piezoelectric layer of the resonator alternately generate positive and negative voltages through which the piezoelectric layer generates acoustic waves, and the acoustic waves in the resonator propagate vertically. To form resonance, it is necessary to totally reflect the acoustic waves on the upper surface of an upper metal electrode and the lower surface of a lower metal electrode to generate standing acoustic waves. The precondition of acoustic wave reflection is that the acoustic impedance of the areas in contact with the upper surface of the upper metal electrode and the lower surface of the lower metal electrode should drastically differ from the acoustic impedance of the metal electrodes.

Film bulk acoustic wave resonators (FBARs) are BAW resonators that are able to restrain acoustic energy inside the devices, wherein air exits above the resonance region of the resonators, a cavity is formed below the resonance region of the resonators, and on account of the large difference in acoustic impedance between air and metal electrodes, acoustic waves can be totally reflected on the upper surface of the upper metal electrode and the lower surface of the lower metal electrode to generate standing waves.

FIG. 2 is a structural diagram of cross-section A of an FBAR 200 which comprises a substrate 201 having an upper surface formed with a cavity 203, an electrode layer 205 (namely, a lower electrode) located over the cavity 203, a piezoelectric layer 207 located on the electrode layer 205, and an electrode layer 209 (namely, an upper electrode) located on the piezoelectric layer 207. With the application of a higher communication frequency band to wireless mobile networks, the electrodes have to be made thinner than before; however, the decrease of the thickness of the electrodes may lead to an increase of the resistance of the electrodes, thus causing larger electrical losses and decreasing the Q value.

BRIEF SUMMARY OF THE INVENTION

The issue to be settled by the invention is to provide a BAW resonance device, a filter device and an RF front-end device to reduce electrical losses.

To settle the aforesaid issue, an embodiment of the invention provides a BAW resonance device which comprises a first layer, a first electrode, a second layer and a second electrode, wherein the first layer comprises a first cavity located on a first side; a first terminal of the first electrode is located in the first cavity, and a second terminal of the first electrode contacts with the first layer; the second layer is located on the first side and is disposed on the first electrode; the second electrode is located on the second layer, and the first electrode and the second electrode are located on two sides of the second layer; a first part, overlapping with the second electrode, of the first electrode is located in the first cavity; the first electrode comprises a first electrode layer and a second electrode layer, and the second electrode layer and the second layer are located on two sides of the first electrode layer; and the second electrode comprises a third electrode layer and a fourth electrode layer, and the second layer and the fourth electrode are located on two sides of the third electrode layer.

In some embodiments, the first layer further comprises an intermediate layer including the first cavity. In some embodiments, the intermediate layer is made of, but not limited to, at least one of the following materials: polymer, insulating dielectric and polysilicon. In some embodiments, the thickness of the intermediate layer is, but not limited to, 0.1 μm-10 μm.

In some embodiments, the first layer further comprises a support layer including the first cavity. In some embodiments, the support layer is made of, but not limited to, at least one of the following materials: polymer, insulating dielectric and polysilicon. In some embodiments, the thickness of the support layer is, but not limited to, 20 μm-100 μm.

In some embodiments, the first layer further comprises a first substrate including the first cavity.

In some embodiments, the first layer further comprises a first groove located on the first side, wherein the first groove is located on one horizontal side of the first cavity and is communicated with the first cavity, and the second terminal is located in the first groove.

In some embodiments, the second layer comprises a piezoelectric layer, and the piezoelectric layer comprises multiple crystal grains including a first crystal grain and a second crystal grain, wherein the first crystal grain and the second crystal grain are any two crystal grains of the multiple crystal grains; a first coordinate axis in a first direction corresponds to the height of the first crystal grain, and a second coordinate axis in a second direction corresponds to the height of the second crystal grain, wherein the first direction is identical with or opposite to the second direction.

In some embodiments, the first crystal grain corresponds to a first coordinate system which includes the first coordinate axis and a third coordinate axis in a third direction, and the second crystal grain corresponds a second coordinate system which includes the second coordinate axis and a fourth coordinate axis in a fourth direction. In some embodiments, the first coordinate system further includes a fifth coordinate axis in a fifth direction, and the second coordinate system further includes a sixth coordinate axis in a sixth direction. In some embodiments, the third direction is identical with or opposite to the fourth direction.

In some embodiments, the second layer comprises a piezoelectric layer, wherein the piezoelectric layer comprises multiple crystal grains, and the full width at half maximum (FWHM) of a rocking curve of a crystal formed by the multiple crystal grains is less than 2.5°.

In some embodiments, the piezoelectric layer is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In some embodiments, the acoustic impedance of the first electrode layer is greater than that of the second electrode layer, the electrical conductivity of the first electrode layer is lower than that of the second electrode layer, the acoustic impedance of the third electrode layer is greater than that of the fourth electrode layer, and the electrical conductivity of the third electrode layer is lower than that of the fourth electrode layer. In some embodiment, the first electrode layer is made of, but not limited to, at least one of the following materials: ruthenium, molybdenum, tungsten, platinum and iridium; the second electrode layer is made of, but not limited to, at least one of the following materials: aluminum and beryllium; the third electrode layer is made of, but not limited to, at least one of the following materials: ruthenium, molybdenum, tungsten, platinum and iridium; and the fourth electrode layer is made of, but not limited to, at least one of the following materials: aluminum and beryllium.

In some embodiments, the acoustic impedance of the first electrode layer is smaller than that of the second electrode layer, the electrical conductivity of the first electrode layer is higher than that of the second electrode layer, the acoustic impedance of the third electrode layer is smaller than that of the fourth electrode layer, and the electrical conductivity of the third electrode layer is greater than that of the fourth electrode layer. In some embodiments, the first electrode layer is made of, but not limited to, at least one of the following materials: aluminum and beryllium; the second electrode layer is made of, but not limited to, at least one of the following materials: ruthenium, molybdenum, tungsten, platinum and iridium; the third electrode layer is made of, but not limited to, at least one of the following materials: aluminum and beryllium; and the fourth electrode layer is made of, but not limited to, at least one of the following materials: ruthenium, molybdenum, tungsten, platinum and iridium.

In some embodiments, the BAW resonance device further comprises a first barrier, wherein the first electrode layer and the second layer are located on two sides of the first barrier, and the acoustic impedance of the first barrier is greater than that of the first electrode layer. In some embodiments, the first barrier is made of, but not limited to, at least one of the following materials: tungsten, tungsten nitride, titanium nitride, cobalt, ruthenium, tantalum, tantalum nitride and indium oxide. In some embodiments, the BAW resonance device further comprises a second barrier, wherein the second layer and the third electrode layer are located on two sides of the second barrier, and the acoustic impedance of the second barrier is greater than that of the third electrode layer. In some embodiments, the second barrier is made of, but not limited to, at least one of the following materials: tungsten, tungsten nitride, titanium nitride, cobalt, ruthenium, tantalum, tantalum nitride and indium oxide.

In some embodiments, the first electrode further comprises a first dielectric layer, wherein the second electrode layer and the first electrode layer are located on two sides of the first dielectric layer, the acoustic impedance of the first dielectric layer is smaller than that of the first electrode layer, and the acoustic impedance of the first dielectric layer is smaller than that of the second electrode layer. In some embodiments, the first dielectric layer is made of, but not limited to, at least one of the following materials: silicon dioxide, silicon oxycarbide, silicon nitride, aluminum nitride, titanium oxide, hafnium oxide and aluminum oxide. In some embodiments, the first dielectric layer comprises at least one second groove, wherein the second electrode layer is inlaid in the at least one second groove and covers the first dielectric layer. In some embodiments, the second electrode further comprises a second dielectric layer, wherein the third electrode layer and the fourth electrode layer are located on two sides of the second dielectric layer, the acoustic impedance of the second dielectric layer is smaller than that of the third electrode layer, and the acoustic impedance of the second dielectric layer is smaller than that of the fourth electrode layer. In some embodiments, the second dielectric layer is made of, but not limited to, at least one of the following materials: silicon dioxide, silicon oxycarbide, silicon nitride, aluminum nitride, titanium oxide, hafnium oxide and aluminum oxide. In some embodiments, the second dielectric layer comprises at least one third groove, wherein the fourth electrode layer is inlaid in the at least one third groove and covers the second dielectric layer.

In some embodiments, the BAW resonance device further comprises a second substrate located on a second side of the first layer, and the second side is opposite to the first side. In some embodiments, the BAW resonance device further comprises a film located between the first layer and the second substrate. In some embodiments, the film includes, but is not limited to, a polycrystalline film.

An embodiment of the invention further provides a filter device which comprises, but is not limited to, at least one BAW resonance device provided by one of the aforementioned embodiments.

An embodiment of the invention further provides an RF front-end device which comprises, but is not limited to, a power amplification device and at least one filter device provided by the aforementioned embodiment, wherein the power amplification device is connected to the filter device.

An embodiment of the invention further provides an RF front-end device which comprises, but is not limited to, a low-noise amplification device and at least one filter device provided by the aforementioned embodiment, wherein the low-noise amplification device is connected to the filter device.

An embodiment of the invention further provides an RF front-end device which comprises, but is not limited to, a multiplexing device, wherein the multiplexing device comprises at least one filter device provided by the aforementioned embodiment.

From the above description, the invention provides a BAW resonance device, a filter device and an RF front-end device. The BAW resonance device comprises a first electrode (namely, a lower electrode) and a second electrode (namely, an upper electrode), wherein the first electrode comprises a first electrode layer and a second electrode layer, the second electrode comprises a third electrode layer and a fourth electrode layer, the electrical conductivity of the second electrode layer is higher than that of the first electrode layer, and the electrical conductivity of the fourth electrode layer is higher than that of the third electrode layer, so that the resistance of the first electrode and the second electrode is reduced, and electrical losses are reduced.

BRIEF DESCRIPTION OF THE SEVERAL VIEWS OF THE DRAWINGS

FIG. 4a is a structural diagram of cross-section A of a BAW resonance device 400 in an embodiment of the invention;

FIG. 4b is a structural diagram of a crystal grain of a hexagonal system;

FIG. 4c (i) is a structural diagram of a crystal grain of an orthorhombic system;

FIG. 4c (ii) is a structural diagram of a crystal grain of a tetragonal system;

FIG. 4c (iii) is a structural diagram of a crystal grain of a cubic system;

DETAILED DESCRIPTION OF THE INVENTION

Figure 1:
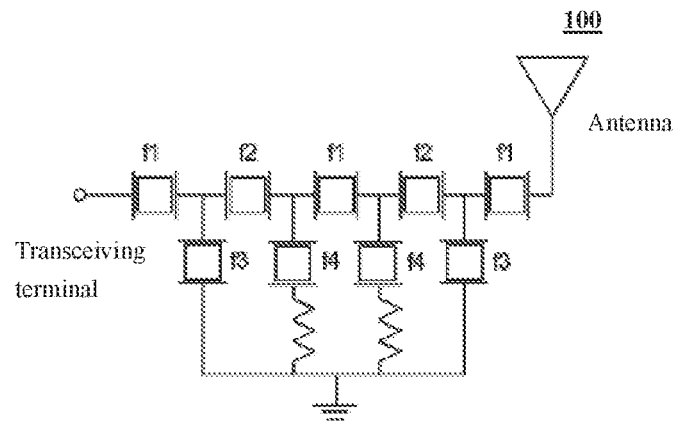
FIG. 1 is a schematic diagram of a circuit 100 of a BAW filter.
Figure 2:
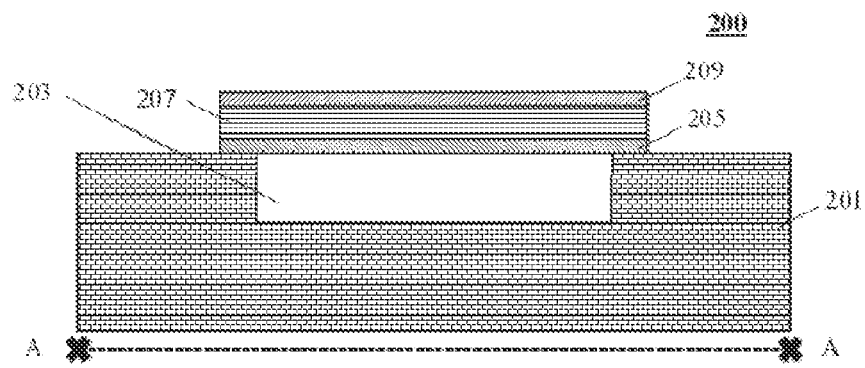
FIG. 2 is a structural diagram of cross-section A of an FBAR 200.

To gain a better understanding of the purposes, features and advantages of the invention, the specific implementations of the invention are expounded below in conjunction with the accompanying drawings.

Many specific details are given in the following description to obtain a comprehensive appreciation of the invention. Clearly, the invention can also be implemented through other embodiments different from those described hereinafter. Hence, the invention is not limited to the specific embodiments disclosed below.

As described in the description of related art, with the application of a higher communication frequency band to wireless mobile networks, the electrodes have to be made thinner than before; however, the decrease of the thickness of the electrodes may lead to an increase of the resistance of the electrodes, thus causing larger electrical losses and decreasing the Q value.

The inventor of the invention finds that a BAW resonance device may comprise a first electrode (namely, a lower electrode) and a second electrode (namely, an upper electrode), wherein the first electrode comprises a first electrode layer and a second electrode layer, the second electrode comprises a third electrode layer and a fourth electrode layer, the electrical conductivity of the second electrode layer is higher than that of the first electrode layer, and the electrical conductivity of the fourth electrode layer is higher than that of the third electrode layer, so that the resistance of the first electrode and the second electrode is reduced, and electrical losses are reduced.

An embodiment of the invention provides a BAW resonance device which comprises a first layer, a first electrode, a second layer and a second electrode, wherein the first layer comprises a first cavity located on a first side; a first terminal of the first electrode is located in the cavity, and a second terminal of the first electrode contacts with the first layer; the second layer is located on the first side and is disposed on the first electrode; the second electrode is located on the second layer, and the first electrode and the second electrode are located on two sides of the second layer respectively; wherein, a first part, overlapping with the second electrode, of the first electrode is located in the first cavity; wherein, the first electrode comprises a first electrode layer and a second electrode layer, and the second electrode layer and the second layer are located on two sides of the first electrode layer respectively; wherein, the second electrode comprises a third electrode layer and a fourth electrode layer, and the second layer and the fourth electrode layer are located on two sides of the third electrode layer respectively.

In some embodiments, the acoustic impedance of the first electrode layer is greater than that of the second electrode layer, the electrical conductivity of the first electrode layer is lower than that of the second electrode layer, the acoustic impedance of the third electrode layer is greater than that of the fourth electrode layer, and the electrical conductivity of the third electrode layer is lower than that of the fourth electrode layer.

It should be noted that the electrical conductivity of the second electrode layer is higher than that of the first electrode layer, and the electrical conductivity of the fourth electrode layer is higher than that of the third electrode layer, so that the resistance of the first electrode layer and the second electrode is reduced, and electrical losses are reduced.

In some embodiments, the first electrode layer is made of, but not limited to, at least one of the following materials: ruthenium, molybdenum, tungsten, platinum and iridium; the second electrode layer is made of, but not limited to, at least one of the following materials: aluminum and beryllium; the third electrode layer is made of, but not limited to, at least one of the following materials: ruthenium, molybdenum, tungsten, platinum and iridium; and the fourth electrode layer is made of, but not limited to, at least one of the following materials: aluminum and beryllium.

In some embodiments, the first layer further comprises a first substrate including the first cavity.

In some embodiments, the first layer further comprises a support layer including the first cavity. In some embodiments, the support layer is made of, but not limited to, at least one of the following materials: polymer, insulating dielectric and polysilicon. In some embodiments, the thickness of the support layer is, but not limited to, 20 μm-100 μm.

In some embodiments, the first layer further comprises an intermediate layer including the first cavity. In some embodiments, the intermediate layer is made of, but not limited to, at least one of the following materials: polymer, insulating dielectric and polysilicon. In some embodiments, the thickness of the intermediate layer is, but not limited to, 0.1 μm-10 μm.

In some embodiments, the first layer further comprises a first groove located on the first side, wherein the first groove is located on one horizontal side of the first cavity and is communicated with the first cavity, and the second terminal is located in the first groove.

In some embodiments, the second layer comprises a piezoelectric layer, wherein the piezoelectric layer comprises multiple crystal grains including a first crystal grain and a second crystal grain, and the first crystal grain and the second crystal grain are any two crystal grains of the multiple crystal grains; a first coordinate axis in a first direction corresponds to the height of the first crystal grain, and a second coordinate axis in a second direction corresponds to the height of the second crystal grain, wherein the first direction is identical with or opposite to the second direction.

In some embodiments, the first crystal grain corresponds to a first coordinate system which includes the first coordinate axis and a third coordinate axis in a third direction, and the second crystal grain corresponds a second coordinate system which includes the second coordinate axis and a fourth coordinate axis in a fourth direction. In some embodiments, the first coordinate system further includes a fifth coordinate axis in a fifth direction, and the second coordinate system further includes a sixth coordinate axis in a sixth direction. In some embodiments, the third direction is identical with or opposite to the fourth direction.

In some embodiments, the piezoelectric layer is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In some embodiments, the second layer comprises a piezoelectric layer, wherein the piezoelectric layer comprises multiple crystal grains, and the FWHM of a rocking curve of a crystal formed by the multiple crystal grains is less than 2.5°. It should be noted that the rocking curve depicts the angular divergence of a specific crystal grain plane (determined by the diffraction angle) in a sample and is represented by a planar coordinate system, wherein the horizontal axis represents the angle between the crystal grain plane and the sample, the vertical axis represents the diffraction intensity of the crystal grain plane under a certain angle, the rocking curve indicates the crystal grain lattice quality, and the smaller the FWHM, the higher the crystal grain lattice quality. In addition, the FWHM indicates the distance between points with two consecutive functional values equal to half of the peak value in one peak of a function.

In some embodiments, the first electrode further comprises a first dielectric layer, wherein the second electrode layer and the first electrode layer are located on two sides of the first dielectric layer respectively, the acoustic impedance of the first dielectric layer is smaller than that of the first electrode layer, and the acoustic impedance of the first dielectric layer is smaller than that of the second electrode layer. In some embodiments, the first dielectric layer is made of, but not limited to, at least one of the following materials: silicon dioxide, silicon oxycarbide, silicon nitride, aluminum nitride, titanium oxide, hafnium oxide and aluminum oxide.

In some embodiments, the second electrode further comprises a second dielectric layer, wherein the third electrode layer and the fourth electrode layer are located on two sides of the second dielectric layer respectively, the acoustic impedance of the second dielectric layer is smaller than that of the third electrode layer, and the acoustic impedance of the second dielectric layer is smaller than that of the fourth electrode layer. In some embodiments, the second dielectric layer is made of, but not limited to, at least one of the following materials: silicon dioxide, silicon oxycarbide, silicon nitride, aluminum nitride, titanium oxide, hafnium oxide and aluminum oxide.

It should be noted that the acoustic impedance of the first dielectric layer is smaller than that of the first electrode layer and the second electrode layer, and the acoustic impedance of the second dielectric layer is smaller than that of the third electrode layer and the fourth electrode layer, so that leaky waves can be blocked.

In some embodiments, the first dielectric layer comprises at least one second groove, and the second electrode layer is inlaid in the at least one second groove and covers the first dielectric layer. In some embodiments, the second dielectric layer comprises at least one third groove, and the fourth electrode layer is inlaid in the at least one third groove and covers the second dielectric layer.

In some embodiments, the BAW resonance device further comprises a second substrate located on a second side of the first layer, and the second side is opposite to the first side.

In some embodiments, the BAW resonance device further comprises a film located between the first layer and the second substrate. In some embodiments, the film includes, but is not limited to, a polycrystalline film. It should be noted that the film can prevent a free electron layer from being formed on the surface of the second substrate, thus reducing the radio frequency loss of the second substrate.

An embodiment of the invention provides a BAW resonance device which comprises a first layer, a first electrode, a second layer and a second electrode, wherein the first layer comprises a first cavity located on a first side; a first terminal of the first electrode is located in the cavity, and a second terminal of the first electrode contacts with the first layer; the second layer is located on the first side and is disposed on the first electrode; the second electrode is located on the second layer, and the first electrode and the second electrode are located on two sides of the second layer respectively; wherein, a first part, overlapping with the second electrode, of the first electrode is located in the first cavity; wherein, the first electrode comprises a first electrode layer and a second electrode layer, and the second electrode layer and the second layer are located on two sides of the first electrode layer respectively; wherein, the second electrode comprises a third electrode layer and a fourth electrode layer, and the second layer and the fourth electrode layer are located on two sides of the third electrode layer respectively.

In some embodiments, the acoustic impedance of the first electrode layer is smaller than that of the second electrode layer, the electrical conductivity of the first electrode layer is higher than that of the second electrode layer, the acoustic impedance of the third electrode layer is smaller than that of the fourth electrode layer, and the electrical conductivity of the third electrode layer is higher than that of the fourth electrode layer.

It should be noted that the electrical conductivity of the first electrode layer is higher than that of the second electrode layer, and the electrical conductivity of the third electrode layer is higher than that of the fourth electrode layer, so that the resistance of the first electrode layer and the second electrode is reduced, and electrical losses are reduced.

In some embodiments, the first electrode layer is made of, but not limited to, at least one of the following materials: aluminum and beryllium; the second electrode layer is made of, but not limited to, at least one of the following materials: ruthenium, molybdenum, tungsten, platinum and iridium; the third electrode layer is made of, but not limited to, at least one of the following materials: aluminum and beryllium; and the fourth electrode layer is made of, but not limited to, at least one of the following materials: ruthenium, molybdenum, tungsten, platinum and iridium.

In some embodiments, the first layer further comprises a first substrate including the first cavity.

In some embodiments, the first layer further comprises a support layer including the first cavity. In some embodiments, the support layer is made of, but not limited to, at least one of the following materials: polymer, insulating dielectric and polysilicon. In some embodiments, the thickness of the support layer is, but not limited to, 20 μm-100 μm.

In some embodiments, the first layer further comprises an intermediate layer including the first cavity. In some embodiments, the intermediate layer is made of, but not limited to, at least one of the following materials: polymer, insulating dielectric and polysilicon. In some embodiments, the thickness of the intermediate layer is, but not limited to, 0.1 μm-10 μm.

In some embodiments, the first layer further comprises a first groove located on the first side, wherein the first groove is located on one horizontal side of the first cavity and is communicated with the first cavity, and the second terminal is located in the first groove.

In some embodiments, the second layer comprises a piezoelectric layer, and the piezoelectric layer comprises multiple crystal grains including a first crystal grain and a second crystal grain, wherein the first crystal grain and the second crystal grain are any two crystal grains of the multiple crystal grains; a first coordinate axis in a first direction corresponds to the height of the first crystal grain, and a second coordinate axis in a second direction corresponds to the height of the second crystal grain, wherein the first direction is identical with or opposite to the second direction.

In some embodiments, the first crystal grain corresponds to a first coordinate system which includes the first coordinate axis and a third coordinate axis in a third direction, and the second crystal grain corresponds a second coordinate system which includes the second coordinate axis and a fourth coordinate axis in a fourth direction. In some embodiments, the first coordinate system further includes a fifth coordinate axis in a fifth direction, and the second coordinate system further includes a sixth coordinate axis in a sixth direction. In some embodiments, the third direction is identical with or opposite to the fourth direction.

In some embodiments, the piezoelectric layer is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In some embodiments, the second layer comprises a piezoelectric layer, wherein the piezoelectric layer comprises multiple crystal grains, and the FWHM of a rocking curve of a crystal formed by the multiple crystal grains is less than 2.5°.

In some embodiments, the BAW resonance device further comprises a first barrier, wherein the first electrode layer and the second layer are located on two sides of the first barrier respectively, the first barrier is used to separate the first electrode layer from the second layer, and the acoustic impedance of the first barrier is greater than that of the first electrode layer. In some embodiments, the BAW resonance device further comprises a second barrier, wherein the second layer and the third electrode layer are located on two sides of the first barrier respectively, the second barrier is used to separate the third electrode layer from the second layer, and the acoustic impedance of the second barrier is greater than that of the third electrode layer. It should be noted that the first barrier and the second barrier can prevent chemical reactions between electrode materials and piezoelectric materials, which may otherwise affect the electrical properties of the resonance device.

In some embodiments, the first barrier is made of, but not limited to, at least one of the following materials: tungsten, tungsten nitride, titanium nitride, cobalt, ruthenium, tantalum, tantalum nitride and indium oxide. In some embodiments, the second barrier is made of, but not limited to, at least one of the following materials: tungsten, tungsten nitride, titanium nitride, cobalt, ruthenium, tantalum, tantalum nitride and indium oxide.

In some embodiments, the BAW resonance device further comprises a second substrate located on a second side of the first layer, and the second side is opposite to the first side.

In some embodiments, the BAW resonance device further comprises a film located between the first layer and the second substrate. In some embodiments, the film includes, but is not limited to, a polycrystalline film. It should be noted that the film can prevent a free electron layer from being formed on the surface of the second substrate, thus reducing the radio frequency loss of the second substrate.

An embodiment of the invention further provides a filter device which comprises, but is not limited to, at least one BAW resonance device provided by one of the aforementioned embodiments.

An embodiment of the invention further provides an RF front-end device which comprises, but is not limited to, a power amplification device and at least one filter device provided by the aforementioned embodiment, wherein the power amplification device is connected to the filter device.

An embodiment of the invention further provides an RF front-end device which comprises, but is not limited to, a low-noise amplification device and at least one filter device provided by the aforementioned embodiment, wherein the low-noise amplification device is connected to the filter device.

An embodiment of the invention further provides an RF front-end device which comprises, but is not limited to, a mulplexing device, wherein the multiplexing device comprises at least one filter device provided by the aforementioned embodiment.

FIG. 3 to FIG. 13 illustrate multiple specific embodiments of the invention. Resonance devices provided by the multiple specific embodiments are of different structures. Obviously, the invention can also be implemented by means of other embodiments different from those described herein. Hence, the invention is not limited to the specific embodiments disclosed below.

Figure 3:
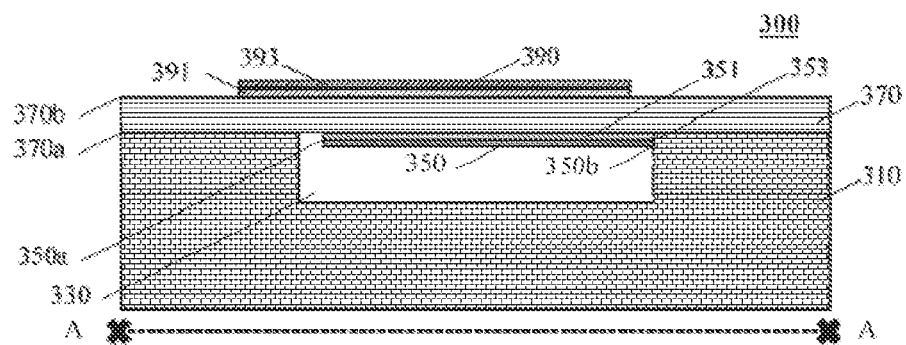
FIG. 3 is a structural diagram of cross-section A of a BAW resonance device 300 in an embodiment of the invention.

FIG. 3 is a structural diagram of cross-section A of a BAW resonance device 300 in an embodiment of the invention.

As shown in FIG. 3, an embodiment of the invention provides a BAW resonance device 300 which comprises a substrate 310, an electrode 350, a piezoelectric layer 370 and an electrode 390, wherein a cavity 330 is formed in the upper surface of the substrate 310; a first terminal 350a of the electrode 350 is located in the cavity 330, and a second terminal 350b of the electrode 350 contacts with the side wall of the cavity 330; the piezoelectric layer 370 is located on the electrode 350, covers the cavity 330 and has a first side 370a and a second side 370b opposite to the first side 370a, and the electrode 350 is located on the first side 370a; and the electrode 390 is located on the second side 370b and is disposed on the piezoelectric layer 370. As can be seen from FIG. 3, a resonance region (namely, an overlap region of the electrode 350 and the electrode 390) is suspended with respect to the cavity 330 and does not overlap with the substrate 310. Wherein, the electrode 350 comprises an electrode layer 351 and an electrode layer 353, wherein the electrode layer 351 is located on the first side 370a and contacts with the piezoelectric layer 370, the electrode layer 353 is located on the first side 370a and contacts with the electrode layer 351, and the electrode layer 353 and the piezoelectric layer 370 are located on two sides of the electrode layer 351 respectively. Wherein, the electrode 390 comprises an electrode layer 391 and an electrode layer 393, wherein the electrode layer 391 is located on the second side 370b and contacts with the piezoelectric layer 370, the electrode layer 393 is located on the second side 370b and contacts with the electrode layer 391, and the piezoelectric layer 370 and the electrode layer 393 are located on two sides of the electrode layer 391 respectively.

In this embodiment, the substrate 310 is made of, but not limited to, at least one of the following materials: silicon, silicon carbide, glass, sapphire, spinel, gallium arsenide and gallium nitride.

In this embodiment, the acoustic impedance of the material of the electrode layer 351 is greater than that of the material of the electrode layer 353. In this embodiment, the electrical conductivity of the material of the electrode layer 353 is higher than that of the material of the electrode layer 351. In this embodiment, the electrode layer 351 is made of, but not limited to, at least one of the following materials: ruthenium, molybdenum, tungsten, platinum and iridium. In this embodiment, the electrode layer 353 is made of, but not limited to, at least one of the following materials: aluminum and beryllium.

In this embodiment, the piezoelectric layer 370 is a flat layer and covers the upper surface of the substrate 310. In this embodiment, the piezoelectric layer 370 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the acoustic impedance of the material of the electrode layer 391 is greater than that of the material of the electrode layer 393. In this embodiment, the electrical conductivity of the material of the electrode layer 393 is higher than that of the material of the electrode layer 391. In this embodiment, the electrode layer 391 is made of, but not limited to, at least one of the following materials: ruthenium, molybdenum, tungsten, platinum and iridium. In this embodiment, the electrode layer 393 is made of, but not limited to, at least one of the following materials: aluminum and beryllium.

In this embodiment, a part, overlapping with the electrode 390, of the electrode 350 is located in the cavity 330, and a part, overlapping with the electrode 350, of the electrode 390 is located over the cavity 330.

It should be noted that the electrical conductivity of the electrode layer 353 and the electrode layer 393 is high, so that the resistance of the electrode 350 and the electrode 390 is reduced, and electrical losses are reduced. In addition, an acoustic impedance difference is formed between the electrode layer 351 and the electrode layer 353, and an acoustic impedance difference is formed between the electrode layer 391 and the electrode layer 393, so that leaky waves can be blocked.

It should be noted that the exchange of materials of the two electrodes can fulfill an extra technical effect and will exert an influence on the piezoelectric constant and electromechanical coupling factor of the resonance device. Please refer to the following specific embodiment for a detailed description.

As shown in FIG. 3, an embodiment of the invention provides a BAW resonance device 300 which comprises a substrate 310, an electrode 350, a piezoelectric layer 370 and an electrode 390, wherein a cavity 330 is formed in the upper surface of the substrate 310; a first terminal 350a of the electrode 350 is located in the cavity 330, and a second terminal 350b of the electrode 350 contacts with the side wall of the cavity 330; the piezoelectric layer 370 is located on the electrode 350, covers the cavity 330 and has a first side 370a and a second side 370b opposite to the first side 370a, and the electrode 350 is located on the first side 370a; and the electrode 390 is located on the second side 370b and is disposed on the piezoelectric layer 370. As can be seen from FIG. 3, a resonance region (namely, an overlap region of the electrode 350 and the electrode 390) is suspended with respect to the cavity 330 and does not overlap with the substrate 310. Wherein, the electrode 350 comprises an electrode layer 351 and an electrode layer 352, wherein the electrode layer 351 is located on the first side 370a and contacts with the piezoelectric layer 370, the electrode layer 352 is located on the first side 370a and contacts with the electrode layer 351, and the electrode layer 352 and the piezoelectric layer 370 are located on two sides of the electrode layer 351 respectively. Wherein, the electrode 390 comprises an electrode layer 391 and an electrode layer 392, wherein the electrode layer 391 is located on the second side 370b and contacts with the piezoelectric layer 370, the electrode layer 392 is located on the second side 370b and contacts with the electrode layer 391, and the piezoelectric layer 370 and the electrode layer 392 are located on two sides of the electrode layer 391 respectively.

In this embodiment, the acoustic impedance of the material of the electrode layer 353 is greater than that of the material of the electrode layer 351. In this embodiment, the electrical conductivity of the material of the electrode layer 351 is higher than that of the material of the electrode layer 353. In this embodiment, the electrode layer 353 is made of, but not limited to, at least one of the following materials: ruthenium, molybdenum, tungsten, platinum and iridium. In this embodiment, the electrode layer 351 is made of, but not limited to, at least one of the following materials: aluminum and beryllium.

In this embodiment, the piezoelectric layer 370 is a flat layer and covers the upper surface of the substrate 310. In this embodiment, the piezoelectric layer 370 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the material of the piezoelectric layer 370 is mixed with a rare earth element, wherein the rare earth element includes, but is not limited to, at least one of scandium, lanthanum and yttrium. It should be noted that the rare earth element mixed in the piezoelectric material can replace a certain proportion of atoms of one element in the piezoelectric material to form a longer chemical bond to generate a pressure. For example, scandium can be mixed in aluminum nitride to replace a certain proportion of aluminum atoms with scandium atoms, and the number of nitrogen atoms remains unchanged, so that a scandium-nitrogen bond longer than an aluminum-nitrogen bond is formed to generate a pressure, and a higher piezoelectric constant and a higher electro-mechanical coupling factor are obtained. Wherein, the certain proportion refers to the ratio of the number of the scandium atoms to the total number of the scandium atoms and the aluminum atoms and ranges from 3% to 40%.

In this embodiment, the acoustic impedance of the material of the electrode layer 393 is greater than that of the material of the electrode layer 391. In this embodiment, the electrical conductivity of the material of the electrode layer 391 is higher than that of the material of the electrode layer 393. In this embodiment, the electrode layer 393 is made of, but not limited to, at least one of the following materials: ruthenium, molybdenum, tungsten, platinum and iridium. In this embodiment, the electrode layer 391 is made of, but not limited to, at least one of the following materials: aluminum and beryllium.

It should be noted that the electrical conductivity of the electrode layer 351 and the electrode layer 391 is high, so that the resistance of the electrode 350 and the electrode 390 is reduced, and electrical losses are reduced. In addition, an acoustic impedance difference is formed between the electrode layer 351 and the electrode layer 353, and an acoustic impedance difference is formed between the electrode layer 391 and the electrode layer 393, so that leaky waves can be blocked. Moreover, the electrode layer 351 and the electrode layer 391 have low acoustic attenuation, so that the acoustic loss is low. Furthermore, the electrode layer 351 and the electrode layer 391 have high thermal conductivity, so that the heat dissipation capacity of the resonance device is improved.

FIG. 4a is a structural diagram of cross-section A of a BAW resonance device 400 in an embodiment of the invention.

As shown in FIG. 4a, an embodiment of the invention provides a BAW resonance device 400 which comprises a substrate 410, an intermediate layer 420, an electrode 440, a piezoelectric layer 450 and an electrode layer 460, wherein the intermediate layer 420 is located on the substrate 410 and is used to block leaky waves, and a cavity 430 is formed in the upper surface of the intermediate layer 420; a first terminal 440a of the electrode 440 is located in the cavity 430, and a second terminal 440b of the electrode 440 contacts with the side wall of the cavity 430; the piezoelectric layer 450 is located on the electrode 440, covers the cavity 430 and has a first side 450a and a second side 450b opposite to the first side 450a, the intermediate layer 420 is located on the first side 450a, and the electrode 440 is located on the first side 450a; and the electrode 460 is located on the second side 450b and is disposed on the piezoelectric layer 450. As can be seen from FIG. 4a, a resonance region (namely, an overlap region of the electrode 440 and the electrode 460) is suspended with respect to the cavity 430 and does not overlap with the intermediate layer 420. Wherein, the electrode 440 comprises an electrode layer 441 and an electrode 442, wherein the electrode layer 441 is located on the first side 450a and contacts with the piezoelectric layer 450, the electrode layer 442 is located on the first side 450a and contacts with the electrode layer 441, and the electrode layer 442 and the piezoelectric layer 450 are located on two sides of the electrode layer 441 respectively. Wherein, the electrode 460 comprises an electrode layer 461 and an electrode layer 462, wherein the electrode layer 461 is located on the second side 450b and contacts with the piezoelectric layer 450, the electrode layer 462 is located on the second side 450b and contacts with the electrode layer 461, and the piezoelectric layer 450 and the electrode layer 462 are located on two sides of the electrode layer 461 respectively.

In this embodiment, the substrate 410 is made of, but not limited to, at least one of the following materials: silicon, silicon carbide, glass, sapphire, spinel, gallium arsenide and gallium nitride.

In this embodiment, the intermediate layer 420 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 420 is, but not limited to, 0.1 μm-10 μm.

In this embodiment, the acoustic impedance of the material of the electrode layer 441 is greater than that of the material of the electrode layer 442. In this embodiment, the electrical conductivity of the material of the electrode layer 442 is higher than that of the material of the electrode layer 441. In this embodiment, the electrode layer 441 is made of, but not limited to, at least one of the following materials: ruthenium, molybdenum, tungsten, platinum and iridium. In this embodiment, the electrode layer 442 is made of, but not limited to, at least one of the following materials: aluminum and beryllium.

In this embodiment, the piezoelectric layer 450 is a flat layer and covers the upper surface of the substrate 420. In this embodiment, the piezoelectric layer 450 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 450 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems. For example, as shown in FIG. 4b, a crystal grain of a hexagonal system, such as an aluminum nitride crystal grain, can be represented by an ac three-dimensional coordinate system (including an a-axis and a c-axis). For another example, as shown in FIG. 4c, crystal grains of an orthorhombic system (a≠b≠c) (i), a tetragonal system (a=b≠c) (ii) and a cubic system (a=b=c) (iii) can be represented by an xyz three-dimensional coordinate system (including an x-axis, a y-axis and a z-axis). In addition to these two examples, the crystal grains can also be represented by other coordinate systems known by those skilled in the art, and thus, the invention is not limited to the two aforementioned examples.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions.

In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 450 comprises multiple crystal grains, wherein the FWHM of a rocking curve of a crystal formed by the multiple crystal grains is less than 2.5°. It should be noted that the rocking curve depicts the angular divergence of a specific crystal grain plane (determined by the diffraction angle) in a sample and is represented by a planar coordinate system, wherein the horizontal axis represents the angle between the crystal grain plane and the sample, the vertical axis represents the diffraction intensity of the crystal grain plane under a certain angle, the rocking curve indicates the crystal grain lattice quality, and the smaller the FWHM, the higher the crystal grain lattice quality. In addition, the FWHM indicates the distance between points with two consecutive functional values equal to half of the peak value in one peak of a function.

It should be noted that the piezoelectric layer 450 formed on a plane does not comprise distinctly turning crystal grains, so that the electro-mechanical coupling factor and Q value of the resonance device are increased.

In this embodiment, the acoustic impedance of the material of the electrode layer 461 is greater than that of the material of the electrode layer 462. In this embodiment, the electrical conductivity of the material of the electrode layer 462 is higher than that of the material of the electrode layer 461. In this embodiment, the electrode layer 461 is made of, but not limited to, at least one of the following materials: ruthenium, molybdenum, tungsten, platinum and iridium. In this embodiment, the electrode layer 462 is made of, but not limited to, at least one of the following materials: aluminum and beryllium.

In this embodiment, a part, overlapping with the electrode 460, of the electrode 440 is located in the cavity 430, and a part, overlapping with the electrode 440, of the electrode 460 is located over the cavity 430.

It should be noted that the electrical conductivity of the electrode layer 442 and the electrode layer 462 is high, so that the resistance of the electrode 440 and the electrode 460 is reduced, and electrical losses are reduced. In addition, an acoustic impedance difference is formed between the electrode layer 441 and the electrode layer 442, and an acoustic impedance difference is formed between the electrode layer 461 and the electrode layer 462, so that leaky waves can be blocked.

It should be noted that the exchange of materials of the two electrodes can fulfill an extra technical effect and will exert an influence on the piezoelectric constant and electro-mechanical coupling factor of the resonance device. Please refer to the following specific embodiment for a detailed description.

As shown in FIG. 4a, an embodiment of the invention provides a BAW resonance device 400 which comprises a substrate 410, an intermediate layer 420, an electrode 440, a piezoelectric layer 450 and an electrode layer 460, wherein the intermediate layer 420 is located on the substrate 410 and is used to block leaky waves, and a cavity 430 is formed in the upper surface of the intermediate layer 420; a first terminal 440a of the electrode 440 is located in the cavity 430, and a second terminal 440b of the electrode 440 contacts with the side wall of the cavity 430; the piezoelectric layer 450 is located on the electrode 440, covers the cavity 430 and has a first side 450a and a second side 450b opposite to the first side 450a, the intermediate layer 420 is located on the first side 450a, and the electrode 440 is located on the first side 450a; and the electrode 460 is located on the second side 450b and is disposed on the piezoelectric layer 450. As can be seen from FIG. 4a, a resonance region (namely, an overlap region of the electrode 440 and the electrode 460) is suspended with respect to the cavity 430 and does not overlap with the intermediate layer 420. Wherein, the electrode 440 comprises an electrode layer 441 and an electrode 442, wherein the electrode layer 441 is located on the first side 450a and contacts with the piezoelectric layer 450, the electrode layer 442 is located on the first side 450a and contacts with the electrode layer 441, and the electrode layer 442 and the electrode layer 450 are located on two sides of the electrode layer 441 respectively. Wherein, the electrode 460 comprises an electrode layer 461 and an electrode layer 462, wherein the electrode layer 461 is located on the second side 450b and contacts with the piezoelectric layer 450, the electrode layer 462 is located on the second side 450b and contacts with the electrode layer 461, and the piezoelectric layer 450 and the electrode layer 462 are located on two sides of the electrode layer 461 respectively.

In this embodiment, the acoustic impedance of the material of the electrode layer 442 is greater than that of the material of the electrode layer 441. In this embodiment, the electrical conductivity of the material of the electrode layer 441 is higher than that of the material of the electrode layer 442. In this embodiment, the electrode layer 442 is made of, but not limited to, at least one of the following materials: ruthenium, molybdenum, tungsten, platinum and iridium. In this embodiment, the electrode layer 441 is made of, but not limited to, at least one of the following materials: aluminum and beryllium.

In this embodiment, the piezoelectric layer 450 is a flat layer and covers the upper surface of the substrate 420. In this embodiment, the piezoelectric layer 450 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the material of the piezoelectric layer 450 is mixed with a rare earth element, wherein the rare earth element includes, but is not limited to, at least one of scandium, lanthanum and yttrium. It should be noted that the rare earth element mixed in the piezoelectric material can replace a certain proportion of atoms of one element in the piezoelectric material to form a longer chemical bond to generate a pressure. For example, scandium can be mixed in aluminum nitride to replace a certain proportion of aluminum atoms with scandium atoms, and the number of nitrogen atoms remains unchanged, so that a scandium-nitrogen bond longer than an aluminum-nitrogen bond is formed to generate a pressure, and a higher piezoelectric constant and a higher electro-mechanical coupling factor are obtained. Wherein, the certain proportion refers to the ratio of the number of the scandium atoms to the total number of the scandium atoms and the aluminum atoms and ranges from 3% to 40%.

In this embodiment, the acoustic impedance of the material of the electrode layer 462 is greater than that of the material of the electrode layer 461. In this embodiment, the electrical conductivity of the material of the electrode layer 461 is higher than that of the material of the electrode layer 462. In this embodiment, the electrode layer 462 is made of, but not limited to, at least one of the following materials: ruthenium, molybdenum, tungsten, platinum and iridium. In this embodiment, the electrode layer 461 is made of, but not limited to, at least one of the following materials: aluminum and beryllium.

It should be noted that the electrical conductivity of the electrode layer 441 and the electrode layer 461 is high, so that the resistance of the electrode 440 and the electrode 460 is reduced, and electrical losses are reduced. In addition, an acoustic impedance difference is formed between the electrode layer 441 and the electrode layer 442, and an acoustic impedance difference is formed between the electrode layer 461 and the electrode layer 462, so that leaky waves can be blocked. Moreover, the electrode layer 441 and the electrode layer 461 have low acoustic attenuation, so that the acoustic loss is low. Furthermore, the electrode layer 441 and the electrode layer 461 have high thermal conductivity, so that the heat dissipation capacity of the resonance device is improved.

Figure 5:
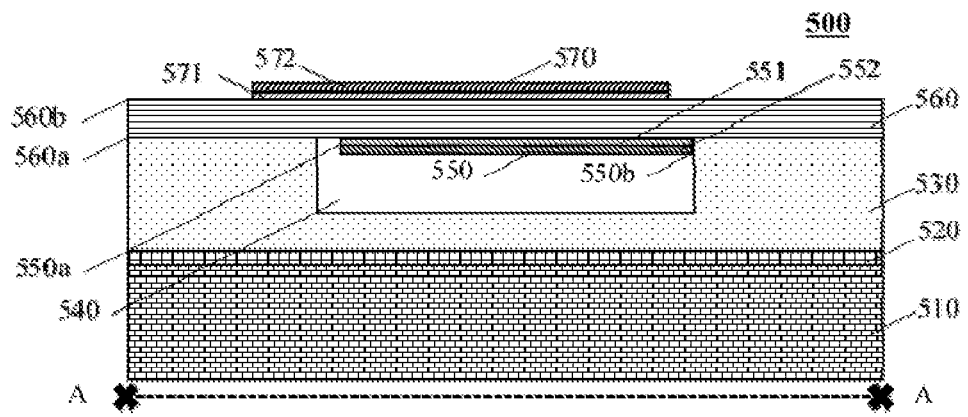
FIG. 5 is a structural diagram of cross-section A of a BAW resonance device 500 in an embodiment of the invention.

FIG. 5 is a structural diagram of cross-section A of a BAW resonance device 500 in an embodiment of the invention.

As shown in FIG. 5, an embodiment of the invention provides a BAW resonance device 500 which comprises a substrate 510, a film 520, an intermediate layer 530, an electrode 550, a piezoelectric layer 560 and an electrode 570, wherein the film 520 is located on the substrate 510; the intermediate layer 530 is located on the film 520 and is used to block leaky waves, and a cavity 540 is formed in the upper surface of the intermediate layer 530; a first terminal 550a of the electrode 550 is located in the cavity 540, and a second terminal 550b of the electrode 550 contacts with the side wall of the cavity 540; the piezoelectric layer 560 is located on the electrode 550, covers the cavity 540 and has a first side 560a and a second side 560b opposite to the first side 560a, the intermediate layer 530 is located on the first side 560a, and the electrode 550 is located on the first side 560a; and the electrode 570 is located on the second side 560b and is disposed on the piezoelectric layer 560. As can be seen from FIG. 5, a resonance region (namely, an overlap region of the electrode 550 and the electrode 570) is suspended with respect to the cavity 540 and does not overlap with the intermediate layer 530. Wherein, the electrode 550 comprises an electrode layer 551 and an electrode layer 552, wherein the electrode layer 551 is located on the first side 560a and contacts with the piezoelectric layer 560, the electrode layer 552 is located on the first side 560a and contacts with the electrode layer 551, and the electrode layer 552 and the piezoelectric layer 560 are located on two sides of the electrode layer 551 respectively. Wherein, the electrode 570 comprises an electrode layer 571 and an electrode layer 572, wherein the electrode layer 571 is located on the second side 560b and contacts with the piezoelectric layer 560, the electrode layer 572 is located on the second side 560b and contacts with the electrode layer 571, and the piezoelectric layer 560 and the electrode layer 572 are located on two sides of the electrode layer 571 respectively.

In this embodiment, the substrate 510 is made of, but not limited to, at least one of the following materials: silicon, silicon carbide, glass, sapphire, spinel, gallium arsenide and gallium nitride.

In this embodiment, the film 520 includes, but is not limited to, a polycrystalline film. In this embodiment, the polycrystalline film is made of, but not limited to, at least one of the following materials: polycrystal grainline silicon, polycrystal grainline silicon nitride and polycrystal grainline silicon carbide. It should be noted that the film 520 can prevent a free electron layer from being formed on the surface of the substrate 510, so that the radio frequency loss of the substrate 510 is reduced.

In this embodiment, the intermediate layer 530 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 530 is, but not limited to, 0.1 µm-10 µm.

In this embodiment, the acoustic impedance of the material of the electrode layer 551 is greater than that of the material of the electrode layer 552. In this embodiment, the electrical conductivity of the material of the electrode layer 552 is higher than that of the material of the electrode layer 551. In this embodiment, the electrode layer 551 is made of, but not limited to, at least one of the following materials: ruthenium, molybdenum, tungsten, platinum and iridium. In this embodiment, the electrode layer 552 is made of, but not limited to, at least one of the following materials: aluminum and beryllium.

In this embodiment, the piezoelectric layer 560 is a flat layer and covers the upper surface of the intermediate layer 530. In this embodiment, the piezoelectric layer 560 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 560 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 560 comprises multiple crystal grains, wherein the FWHM of a rocking curve of a crystal formed by the multiple crystal grains is less than 2.5°.

It should be noted that the piezoelectric layer 560 formed on a plane does not comprise distinctly turning crystal grains, so that the electro-mechanical coupling factor and Q value of the resonance device are increased.

In this embodiment, the acoustic impedance of the material of the electrode layer 571 is greater than that of the material of the electrode layer 572. In this embodiment, the electrical conductivity of the material of the electrode layer 572 is higher than that of the material of the electrode layer 571. In this embodiment, the electrode layer 571 is made of, but not limited to, at least one of the following materials: ruthenium, molybdenum, tungsten, platinum and iridium. In this embodiment, the electrode layer 572 is made of, but not limited to, at least one of the following materials: aluminum and beryllium.

In this embodiment, a part, overlapping with the electrode 570, of the electrode 550 is located in the cavity 540, and a part, overlapping with the electrode 550, of the electrode 570 is located over the cavity 540.

It should be noted that the electrical conductivity of the electrode layer 552 and the electrode layer 572 is high, so that the resistance of the electrode 550 and the electrode 570 is reduced, and electrical losses are reduced. In addition, an acoustic impedance difference is formed between the electrode layer 551 and the electrode layer 552, and an acoustic impedance difference is formed between the electrode layer 571 and the electrode layer 572, so that leaky waves can be blocked.

Figure 6:
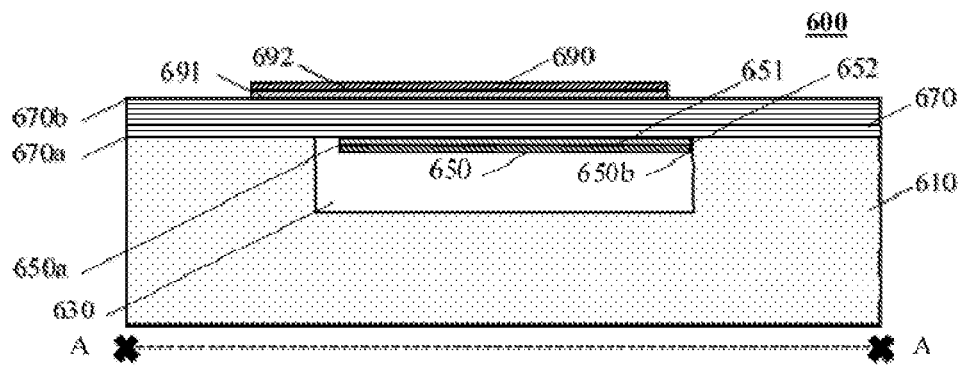
FIG. 6 is a structural diagram of cross-section A of a BAW resonance device 600 in an embodiment of the invention.

FIG. 6 is a structural diagram of cross-section A of a BAW resonance device 600 in an embodiment of the invention.

As shown in FIG. 6, an embodiment of the invention provides a BAW resonance device 600 which comprises a support layer 610, an electrode 650, a piezoelectric layer 670 and an electrode 690, wherein a cavity 630 is formed in the upper surface of the support layer 610; a first terminal 650a of the electrode 650 is located in the cavity 630, and a second terminal 650b of the electrode 650 contacts with the side wall of the cavity 630; the piezoelectric layer 670 is located on the electrode 650, covers the cavity 630 and has a first side 670a and a second side 670b opposite to the first side 670a, the support layer 610 is located on the first side 670a, and the electrode 650 is also located on the first side 670a; and the electrode 690 is located on the second side 670a and is disposed on the piezoelectric layer 670. As can be seen from FIG. 6, a resonance region (namely, an overlap region of the electrode 650 and the electrode 690) is suspended with respect to the cavity 630 and does not overlap with the support layer 610. Wherein, the electrode 650 comprises an electrode layer 651 and an electrode layer 652, wherein the electrode layer 651 is located on the first side 670a and contacts with the electrode layer 670, the electrode layer 652 is located on the first side 670a and contacts with the electrode layer 651, and the electrode layer 652 and the piezoelectric layer 670 are located on two sides of the electrode layer 651 respectively. Wherein, the electrode 690 comprises an electrode layer 691 and an electrode layer 692, wherein the electrode layer 691 is located on the second side 670b and contacts with the piezoelectric layer 670, the electrode layer 692 is located on the second side 670b and contacts with the electrode layer 691, and the piezoelectric layer 670 and the electrode layer 692 are located on two sides of the electrode layer 691 respectively.

In this embodiment, the support layer 610 is made of, but not limited to, polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the support layer 610 is, but not limited to, 20 µm-100 µm.

In this embodiment, the acoustic impedance of the material of the electrode layer 651 is greater than that of the material of the electrode layer 652. In this embodiment, the electrical conductivity of the material of the electrode layer 652 is higher than that of the material of the electrode layer 651. In this embodiment, the electrode layer 651 is made of, but not limited to, at least one of the following materials: ruthenium, molybdenum, tungsten, platinum and iridium. In this embodiment, the electrode layer 652 is made of, but not limited to, at least one of the following materials: aluminum and beryllium.

In this embodiment, the piezoelectric layer 670 is a flat layer and covers the upper surface of the support layer 610. In this embodiment, the piezoelectric layer 670 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 670 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 670 comprises multiple crystal grains, wherein the FWHM of a rocking curve of a crystal formed by the multiple crystal grains is less than 2.5°.

It should be noted that the piezoelectric layer 670 formed on a plane does not comprise distinctly turning crystal grains, so that the electro-mechanical coupling factor and Q value of the resonance device are increased.

In this embodiment, the acoustic impedance of the material of the electrode layer 691 is greater than that of the material of the electrode layer 692. In this embodiment, the electrical conductivity of the material of the electrode layer 692 is higher than that of the material of the electrode layer 691. In this embodiment, the electrode layer 691 is made of, but not limited to, at least one of the following materials: ruthenium, molybdenum, tungsten, platinum and iridium. In this embodiment, the electrode layer 692 is made of, but not limited to, at least one of the following materials: aluminum and beryllium.

In this embodiment, a part, overlapping with the electrode 690, of the electrode 650 is located in the cavity 630, and a part, overlapping with the electrode 650, of the electrode 690 is located over the cavity 630.

It should be noted that the electrical conductivity of the electrode layer 652 and the electrode layer 692 is high, so that the resistance of the electrode 650 and the electrode 690 is reduced, and electrical losses are reduced. In addition, an acoustic impedance difference is formed between the electrode layer 651 and the electrode layer 652, and an acoustic impedance difference is formed between the electrode layer 691 and the electrode layer 692, so that leaky waves can be blocked.

Figure 7:
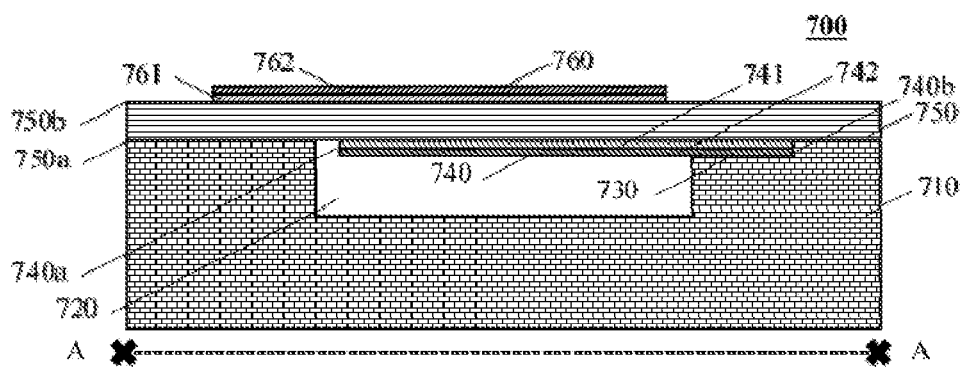
FIG. 7 is a structural diagram of cross-section A of a BAW resonance device 700 in an embodiment of the invention.

FIG. 7 is a structural diagram of cross-section A of a BAW resonance device 700 in an embodiment of the invention.

As shown in FIG. 7, an embodiment of the invention provides a BAW resonance device 700 which comprises a substrate 710, an electrode 740, a piezoelectric layer 750 and an electrode 760, wherein a cavity 720 and a groove 730 are formed in the upper surface of the substrate 710, the groove 730 is located on one of the left and right sides (namely, one of the two horizontal sides) of the cavity 720 and is communicated with the cavity 720, and the depth of the groove 730 is smaller than that of the cavity 720; a first terminal 740a of the electrode 740 is located in the cavity 720, a second terminal 740b of the electrode 740 is located in the groove 730, and the depth of the groove 730 is equal to the thickness of the electrode 740; the piezoelectric layer 750 is located on the electrode 740, covers the cavity 720 and has a first side 750a and a second side 750b opposite to the first side 750a, and the electrode 740 is located on the first side 750a; and the electrode 760 is located on the second side 750b and is disposed on the piezoelectric layer 750. As can be seen from FIG. 7, a resonance region (namely, an overlap region of the electrode 740 and the electrode 760) is suspended with respect to the cavity 720 and does not overlap with the substrate 710. Wherein, the electrode 740 comprises an electrode layer 741 and an electrode layer 742, wherein the electrode layer 741 is located on the first side 750a and contacts with the piezoelectric layer 750, the electrode layer 742 is located on the first side 750a and contacts with the electrode layer 741, and the electrode layer 742 and the piezoelectric layer 750 are located on two sides of the electrode layer 741 respectively. Wherein, the electrode 760 comprises an electrode layer 761 and an electrode layer 762, wherein the electrode layer 761 is located on the second side 750b and contacts with the piezoelectric layer 750, the electrode layer 762 is located on the second side 750b and contacts with the electrode layer 761, and the piezoelectric layer 750 and the electrode layer 762 are located on two sides of the electrode layer 761 respectively.

In this embodiment, the substrate 710 is made of, but not limited to, at least one of the following materials: silicon, silicon carbide, glass, sapphire, spinel, gallium arsenide and gallium nitride.

In this embodiment, the acoustic impedance of the material of the electrode layer 741 is greater than that of the material of the electrode layer 742. In this embodiment, the electrical conductivity of the material of the electrode layer 742 is higher than that of the material of the electrode layer 741. In this embodiment, the electrode layer 741 is made of, but not limited to, at least one of the following materials: ruthenium, molybdenum, tungsten, platinum and iridium. In this embodiment, the electrode layer 742 is made of, but not limited to, at least one of the following materials: aluminum and beryllium.

In this embodiment, the piezoelectric layer 750 is a flat layer and covers the upper surface of the substrate 710. In this embodiment, the piezoelectric layer 750 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the acoustic impedance of the material of the electrode layer 761 is greater than that of the material of the electrode layer 762. In this embodiment, the electrical conductivity of the material of the electrode layer 762 is higher than that of the material of the electrode layer 761. In this embodiment, the electrode layer 761 is made of, but not limited to, at least one of the following materials: ruthenium, molybdenum, tungsten, platinum and iridium. In this embodiment, the electrode layer 762 is made of, but not limited to, at least one of the following materials: aluminum and beryllium.

In this embodiment, a part, overlapping with the electrode 760, of the electrode 740 is located in the cavity 720, and a part, overlapping with the electrode 740, of the electrode 760 is located over the cavity 720.

It should be noted that the electrical conductivity of the electrode layer 742 and the electrode layer 762 is high, so that the resistance of the electrode 740 and the electrode 760 is reduced, and electrical losses are reduced. In addition, an acoustic impedance difference is formed between the electrode layer 741 and the electrode layer 742, and an acoustic impedance difference is formed between the electrode layer 761 and the electrode layer 762, so that leaky waves can be blocked.

It should be noted that the exchange of materials of the two electrodes can fulfill an extra technical effect and will exert an influence on the piezoelectric constant and electro-mechanical coupling factor of the resonance device. Please refer to the following specific embodiment for a detailed description.

As shown in FIG. 7, an embodiment of the invention provides a BAW resonance device 700 which comprises a substrate 710, an electrode 740, a piezoelectric layer 750 and an electrode 760, wherein a cavity 720 and a groove 730 are formed in the upper surface of the substrate 710, the groove 730 is located on one of the left and right sides (namely, one of the two horizontal sides) of the cavity 720 and is communicated with the cavity 720, and the depth of the groove 730 is smaller than that of the cavity 720; a first terminal 740*a* of the electrode 740 is located in the cavity 720, a second terminal 740*b* of the electrode 740 is located in the groove 730, and the depth of the groove 730 is equal to the thickness of the electrode 740; the piezoelectric layer 750 is located on the electrode 740, covers the cavity 720 and has a first side 750*a* and a second side 750*b* opposite to the first side 750*a*, and the electrode 740 is located on the first side 750*a*; and the electrode 760 is located on the second side 750*b* and is disposed on the piezoelectric layer 750. As can be seen from FIG. 7, a resonance region (namely, an overlap region of the electrode 740 and the electrode 760) is suspended with respect to the cavity 720 and does not overlap with the substrate 710. Wherein, the electrode 740 comprises an electrode layer 741 and an electrode layer 742, wherein the electrode layer 741 is located on the first side 750*a* and contacts with the piezoelectric layer 750, the electrode layer 742 is located on the first side 750*a* and contacts with the electrode layer 741, and the electrode layer 742 and the piezoelectric layer 750 are located on two sides of the electrode layer 741 respectively. Wherein, the electrode 760 comprises an electrode layer 761 and an electrode layer 762, wherein the electrode layer 761 is located on the second side 750*b* and contacts with the piezoelectric layer 750, the electrode layer 762 is located on the second side 750*b* and contacts with the electrode layer 761, and the piezoelectric layer 750 and the electrode layer 762 are located on two sides of the electrode layer 761 respectively.

In this embodiment, the acoustic impedance of the material of the electrode layer 742 is greater than that of the material of the electrode layer 741. In this embodiment, the electrical conductivity of the material of the electrode layer 741 is higher than that of the material of the electrode layer 742. In this embodiment, the electrode layer 742 is made of, but not limited to, at least one of the following materials: ruthenium, molybdenum, tungsten, platinum and iridium. In this embodiment, the electrode layer 741 is made of, but not limited to, at least one of the following materials: aluminum and beryllium.

In this embodiment, the piezoelectric layer 750 is a flat layer and covers the upper surface of the intermediate layer 710. In this embodiment, the piezoelectric layer 750 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the material of the piezoelectric layer 750 is mixed with a rare earth element, wherein the rare earth element includes, but is not limited to, at least one of scandium, lanthanum and yttrium. It should be noted that the rare earth element mixed in the piezoelectric material can replace a certain proportion of atoms of one element in the piezoelectric material to form a longer chemical bond to generate a pressure. For example, scandium can be mixed in aluminum nitride to replace a certain proportion of aluminum atoms with scandium atoms, and the number of nitrogen atoms remains unchanged, so that a scandium-nitrogen bond longer than an aluminum-nitrogen bond is formed to generate a pressure, and a higher piezoelectric constant and a higher electro-mechanical coupling factor are obtained. Wherein, the certain proportion refers to the ratio of the number of the scandium atoms to the total number of the scandium atoms and the aluminum atoms and ranges from 3% to 40%.

In this embodiment, the acoustic impedance of the material of the electrode layer 762 is greater than that of the material of the electrode layer 761. In this embodiment, the electrical conductivity of the material of the electrode layer 761 is higher than that of the material of the electrode layer 762. In this embodiment, the electrode layer 762 is made of, but not limited to, at least one of the following materials: ruthenium, molybdenum, tungsten, platinum and iridium. In this embodiment, the electrode layer 761 is made of, but not limited to, at least one of the following materials: aluminum and beryllium.

It should be noted that the electrical conductivity of the electrode layer 741 and the electrode layer 761 is high, so that the resistance of the electrode 740 and the electrode 760 is reduced, and electrical losses are reduced. In addition, an acoustic impedance difference is formed between the electrode layer 741 and the electrode layer 742, and an acoustic impedance difference is formed between the electrode layer 761 and the electrode layer 762, so that leaky waves can be blocked. Moreover, the electrode layer 741 and the electrode layer 761 have low acoustic attenuation, so that the acoustic loss is low. Furthermore, the electrode layer 741 and the electrode layer 761 have high thermal conductivity, so that the heat dissipation capacity of the resonance device is improved.

Figure 8A:
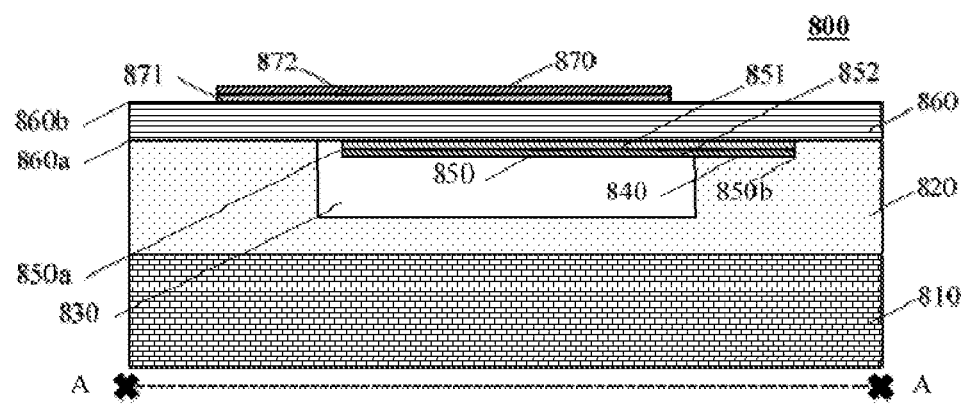
FIG. 8a is a structural diagram of cross-section A of a BAW resonance device 800 in an embodiment of the invention.

FIG. 8*a* is a structural diagram of cross-section A of a BAW resonance device 800 in an embodiment of the invention.

As shown in FIG. 8*a*, an embodiment of the invention provides a BAW resonance device 800 which comprises a substrate 810, an intermediate layer 820, an electrode 850, a piezoelectric layer 860 and an electrode 870, wherein the intermediate layer 820 is located on the substrate 810 and is used to block leaky waves, a cavity 830 and a groove 840 are formed in the upper surface of the intermediate layer 820, the groove 840 is located on one of the left and right sides of the cavity 830 and is communicated with the cavity 830, and the depth of the groove 840 is smaller than that of the cavity 830; a first terminal 850*a* of the electrode 850 is located in the cavity 830, a second terminal 850*b* of the electrode 850 is located in the groove 840, and the depth of the groove 840 is equal to the thickness of the electrode 850; the piezoelectric layer 860 is located on the electrode 850, covers the cavity 830 and has a first side 860*a* and a second side 860*b* opposite to the first side 860*a*, the intermediate layer 820 is located on the first side 860*a*, and the electrode 850 is also located on the first side 860*a*; and the electrode 870 is located on the second side 860*b* and is disposed on the piezoelectric layer 860. As can be seen from FIG. 8*a*, a resonance region (namely, an overlap region of the electrode 850 and the electrode 870) is suspended with respect to the cavity 830 and does not overlap with the intermediate layer 820. Wherein, the electrode 850 comprises an electrode layer 851 and an electrode layer 852, wherein the electrode layer 851 is located on the first side 860*a* and contacts with the piezoelectric layer 860, the electrode layer 852 is located on the first side 860*a* and contacts with the electrode layer 851, and the electrode layer 852 and the piezoelectric layer 860 are located on two sides of the electrode layer 851 respectively. Wherein, the electrode 870 comprises an electrode layer 871 and an electrode layer 872, wherein the electrode layer 871 is located on the second side 860*b* and contacts with the piezoelectric layer 860, the electrode layer 872 is located on the second side 860*b* and contacts with the electrode layer 871, and the piezoelectric layer 860 and the electrode layer 872 are located on two sides of the electrode layer 871 respectively.

In this embodiment, the substrate 810 is made of, but not limited to, at least one of the following materials: silicon, silicon carbide, glass, sapphire, spinel, gallium arsenide and gallium nitride.

In this embodiment, the intermediate layer 820 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 820 is, but not limited to, 0.1 μm-10 μm.

In this embodiment, the acoustic impedance of the material of the electrode layer 851 is greater than that of the material of the electrode layer 852. In this embodiment, the electrical conductivity of the material of the electrode layer 852 is higher than that of the material of the electrode layer 851. In this embodiment, the electrode layer 851 is made of, but not limited to, at least one of the following materials: ruthenium, molybdenum, tungsten, platinum and iridium. In this embodiment, the electrode layer 852 is made of, but not limited to, at least one of the following materials: aluminum and beryllium.

In this embodiment, the piezoelectric layer 860 is a flat layer and covers the upper surface of the substrate 820. In this embodiment, the piezoelectric layer 860 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 860 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In this embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In this embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 860 comprises multiple crystal grains, wherein the FWHM of a rocking curve of a crystal formed by the multiple crystal grains is less than 2.5°.

It should be noted that the piezoelectric layer 860 formed on a plane does not comprise distinctly turning crystal grains, so that the electro-mechanical coupling factor and Q value of the resonance device are increased.

In this embodiment, the acoustic impedance of the material of the electrode layer 871 is greater than that of the material of the electrode layer 872. In this embodiment, the electrical conductivity of the material of the electrode layer 872 is higher than that of the material of the electrode layer 871. In this embodiment, the electrode layer 871 is made of, but not limited to, at least one of the following materials: ruthenium, molybdenum, tungsten, platinum and iridium. In this embodiment, the electrode layer 872 is made of, but not limited to, at least one of the following materials: aluminum and beryllium.

In this embodiment, a part, overlapping with the electrode 870, of the electrode 850 is located in the cavity 830, and a part, overlapping with the electrode 850, of the electrode 870 is located above the cavity 830.

Figure 8B:
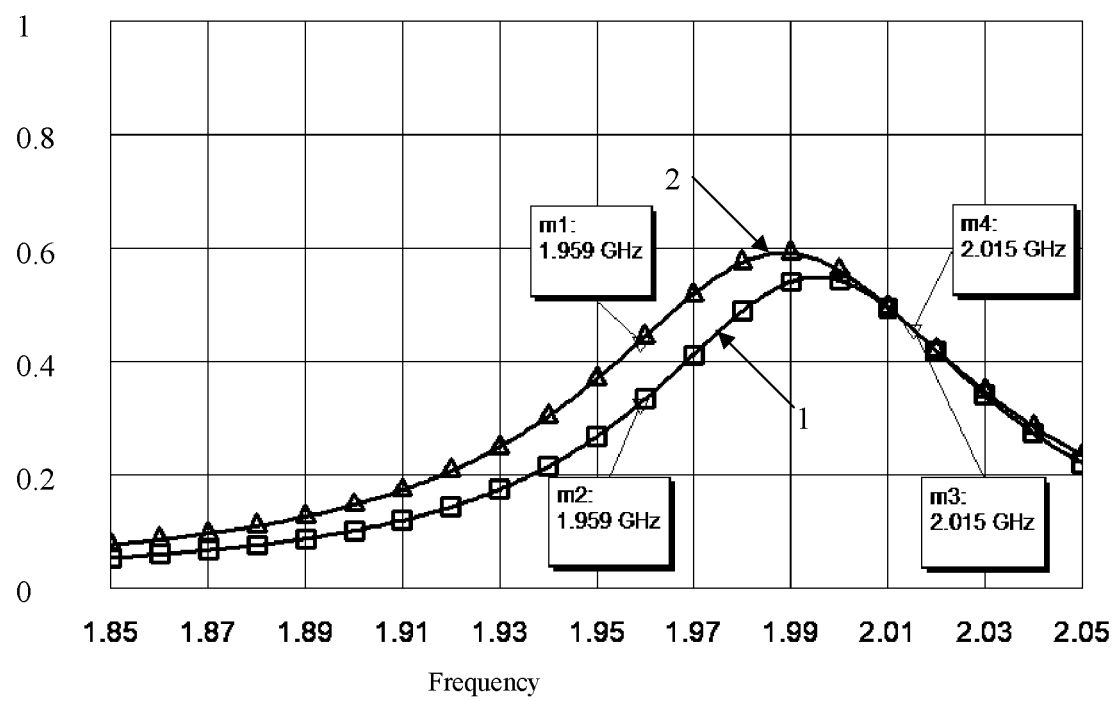
FIG. 8b is curve chart of the insertion loss in an embodiment of the invention.

Refer to FIG. 8b, wherein the vertical axis of FIG. 8b represents the normalized Q value, and the horizontal axis of FIG. 8b refers to the frequency (unit: GHz). FIG. 8b includes an insertion loss curve 1 and an insertion loss curve 2, wherein the insertion loss curve 1 corresponds to a resonance device comprising electrodes with single electrode layers (that is, a lower electrode of the resonance device comprises one electrode layer, and an upper electrode of the resonance device comprises one electrode layer), and the insertion loss curve 2 corresponds to the resonance device 800 provided by the embodiment of the invention, wherein, within the frequency band from 1.85 GHz to 2 GHz, the Q value of the insertion loss curve 2 is higher than the Q value of the insertion loss curve 1. It should be noted that the electrical conductivity of the electrode layer 852 and the electrode layer 872 is high, so that the resistance of the electrode 850 and the electrode 870 is reduced, electrical losses are reduced, and the Q value is increased. In addition, an acoustic impedance difference is formed between the electrode layer 851 and the electrode layer 852, and an acoustic impedance difference is formed between the electrode layer 871 and the electrode layer 872, so that leaky waves can be blocked.

It should be noted that the exchange of materials of the two electrodes can fulfill an extra technical effect and will exert an influence on the piezoelectric constant and electromechanical coupling factor of the resonance device. Please refer to the following specific embodiment for a detailed description.

As shown in FIG. 8a, an embodiment of the invention provides a BAW resonance device 800 which comprises a substrate 810, an intermediate layer 820, an electrode 850, a piezoelectric layer 860 and an electrode 870, wherein the intermediate layer 820 is located on the substrate 810 and is used to block leaky waves, a cavity 830 and a groove 840 are formed in the upper surface of the intermediate layer 820, the groove 840 is located on one of the left and right sides of the cavity 830 and is communicated with the cavity 830, and the depth of the groove 840 is smaller than that of the cavity 830; a first terminal 850a of the electrode 850 is located in the cavity 830, a second terminal 850b of the electrode 850 is located in the groove 840, and the depth of the groove 840 is equal to the thickness of the electrode 850; the piezoelectric layer 860 is located on the electrode 850, covers the cavity 830 and has a first side 860a and a second side 860b opposite to the first side 860a, the intermediate layer 820 is located on the first side 860a, and the electrode 850 is also located on the first side 860a; and the electrode 870 is located on the second side 860b and is disposed on the piezoelectric layer 860. As can be seen from FIG. 8a, a resonance region (namely, an overlap region of the electrode 850 and the electrode 870) is suspended with respect to the cavity 830 and does not overlap with the intermediate layer 820. Wherein, the electrode 850 comprises an electrode layer 851 and an electrode layer 852, wherein the electrode layer 851 is located on the first side 860a and contacts with the piezoelectric layer 860, the electrode layer 852 is located on the first side 860a and contacts with the electrode layer 851, and the electrode layer 852 and the piezoelectric layer 860 are located on two sides of the electrode layer 851 respectively. Wherein, the electrode 870 comprises an electrode layer 871 and an electrode layer 872, wherein the electrode layer 871 is located on the second side 860b and contacts with the piezoelectric layer 860, the electrode layer 872 is located on the second side 860b and contacts with the electrode layer 871, and the piezoelectric layer 860 and the electrode layer 872 are located on two sides of the electrode layer 871 respectively.

In this embodiment, the acoustic impedance of the material of the electrode layer 852 is greater than that of the material of the electrode layer 851. In this embodiment, the electrical conductivity of the material of the electrode layer 851 is higher than that of the material of the electrode layer 852. In this embodiment, the electrode layer 852 is made of, but not limited to, at least one of the following materials: ruthenium, molybdenum, tungsten, platinum and iridium. In this embodiment, the electrode layer 851 is made of, but not limited to, at least one of the following materials: aluminum and beryllium.

In this embodiment, the piezoelectric layer 860 is a flat layer and covers the upper surface of the intermediate layer 820. In this embodiment, the piezoelectric layer 860 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the material of the piezoelectric layer 860 is mixed with a rare earth element, wherein the rare earth element includes, but is not limited to, at least one of scandium, lanthanum and yttrium. It should be noted that the rare earth element mixed in the piezoelectric material can replace a certain proportion of atoms of one element in the piezoelectric material to form a longer chemical bond to generate a pressure. For example, scandium can be mixed in aluminum nitride to replace a certain proportion of aluminum atoms with scandium atoms, and the number of nitrogen atoms remains unchanged, so that a scandium-nitrogen bond longer than an aluminum-nitrogen bond is formed to generate a pressure, and a higher piezoelectric constant and a higher electro-mechanical coupling factor are obtained. Wherein, the certain proportion refers to the ratio of the number of the scandium atoms to the total number of the scandium atoms and the aluminum atoms and ranges from 3% to 40%.

In this embodiment, the acoustic impedance of the material of the electrode layer 872 is greater than that of the material of the electrode layer 871. In this embodiment, the electrical conductivity of the material of the electrode layer 871 is higher than that of the material of the electrode layer 872. In this embodiment, the electrode layer 872 is made of, but not limited to, at least one of the following materials: ruthenium, molybdenum, tungsten, platinum and iridium. In this embodiment, the electrode layer 871 is made of, but not limited to, at least one of the following materials: aluminum and beryllium.

Figure 8C:
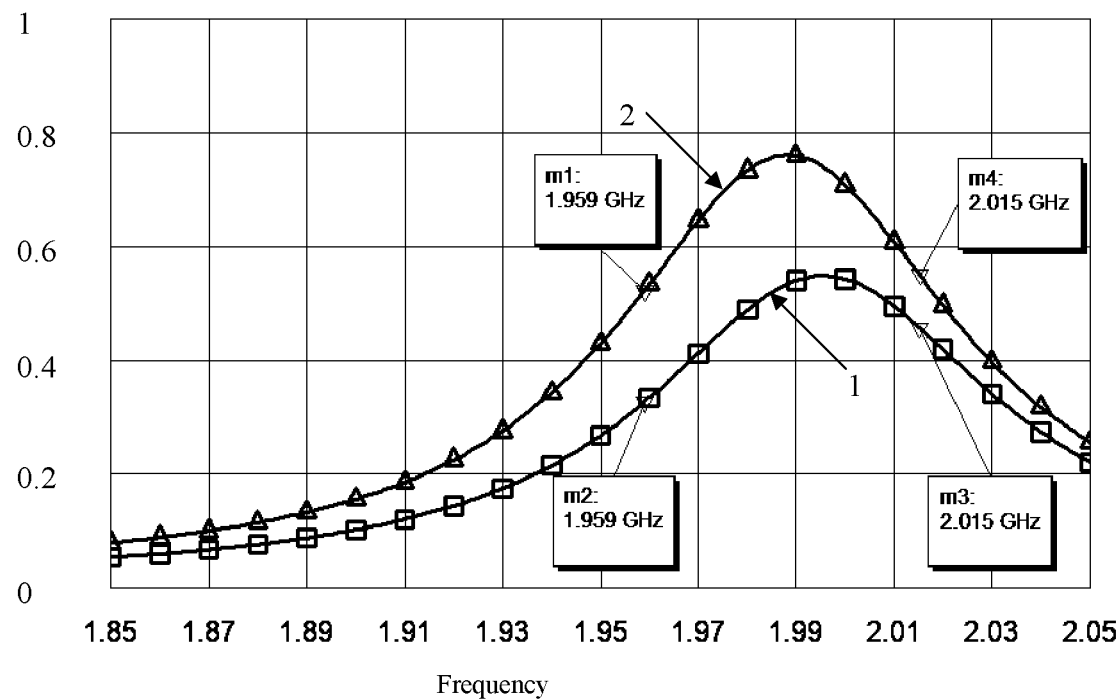
FIG. 8c is a curve chart of the insertion loss in an embodiment of the invention.

Refer to FIG. 8c, wherein the vertical axis of FIG. 8c represents the normalized Q value, and the horizontal axis of FIG. 8c refers to the frequency (unit: GHz). FIG. 8c includes an insertion loss curve 1 and an insertion loss curve 2, wherein the insertion loss curve 1 corresponds to a resonance device comprising electrodes with single electrode layers (that is, a lower electrode of the resonance device comprises one electrode layer, and an upper electrode of the resonance device comprises one electrode layer), and the insertion loss curve 2 corresponds to the resonance device 800 provided by the embodiment of the invention, wherein, within the frequency band from 1.85 GHz to 2 GHz, the Q value of the insertion loss curve 2 is higher than the Q value of the insertion loss curve 1. It should be noted that the electrical conductivity of the electrode layer 851 and the electrode layer 871 is high, so that the resistance of the electrode 850 and the electrode 870 is reduced, electrical losses are reduced, and the Q value is increased. In addition, an acoustic impedance difference is formed between the electrode layer 851 and the electrode layer 852, and an acoustic impedance difference is formed between the electrode layer 871 and the electrode layer 872, so that leaky waves can be blocked. In addition, the electrode layer 851 and the electrode layer 871 have low acoustic attenuation, so that the acoustic loss is low, and the Q value is increased. In addition, the electrode layer 851 and the electrode layer 871 have high conductivity, so that the heat dissipation capacity of the resonance device is improved.

Figure 9:
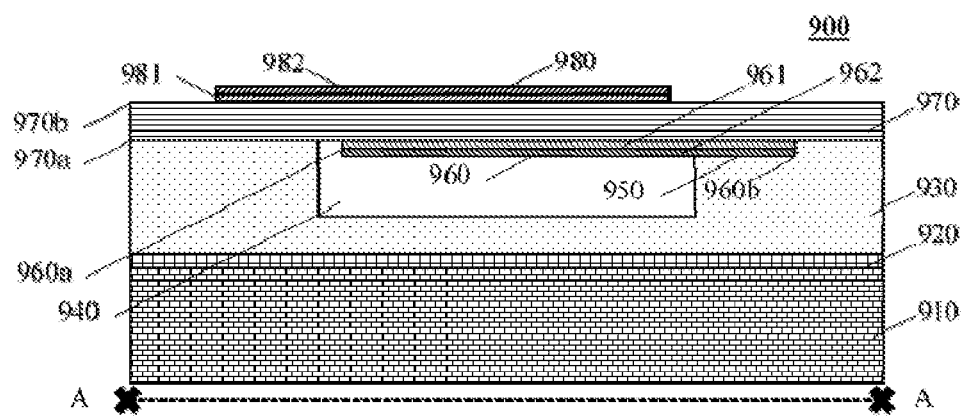
FIG. 9 is a structural diagram of cross-section A of a BAW resonance device 900 in an embodiment of the invention.

FIG. 9 is a structural diagram of cross-section A of a SAW resonance device 900 in an embodiment of the invention.

As shown in FIG. 9, an embodiment of the invention provides a BAW resonance device 900 which comprises a substrate 910, a film 920, an intermediate layer 930, an electrode layer 960, a piezoelectric layer 970 and an electrode layer 980, wherein the film 920 is located on the substrate 910; the intermediate layer 930 is located on the film 920 and is used to block leaky waves, a cavity 940 and a groove 950 are formed in the upper surface of the intermediate layer 930, the groove 950 is located on one of the left and right sides of the cavity 940 and is communicated with the cavity 940, and the depth of the groove 950 is smaller than that of the cavity 940; a first terminal 960a of the electrode 960 is located in the cavity 940, a second terminal 960b of the electrode 960 is located in the groove 950, and the depth of the groove 950 is equal to the thickness of the electrode 960; the piezoelectric layer 970 is located on the electrode layer 960, covers the cavity 940 and has a first side 970a and a second side 970b opposite to the first side 970a, the intermediate layer 930 is located on the first side 970a, and the electrode 960 is located on the first side 970a; and the electrode 980 is located on the second side 970b and is disposed on the piezoelectric layer 970. As can be seen from FIG. 9, a resonance region (namely, an overlap region of the electrode 960 and the electrode 980) is suspended with respect to the cavity 940 and does not overlap with the intermediate layer 930. Wherein, the electrode 960 comprises an electrode layer 961 and an electrode layer 962, wherein the electrode layer 961 is located on the first side 970a and contacts with the piezoelectric layer 970; the electrode layer 962 is located on the first side 970a and contacts with the electrode layer 961, and the electrode layer 962 and the piezoelectric layer 970 are located on two sides of the electrode layer 961 respectively. Wherein, the electrode 980 comprises an electrode layer 981 and an electrode layer 982, wherein the electrode layer 981 is located on the second side 970b and contacts with the piezoelectric layer 970, the electrode layer 982 is located on the second side 970b and contacts with the electrode layer 981, and the piezoelectric layer 970 and the electrode layer 982 are located on two sides of the electrode layer 981 respectively.

In this embodiment, the substrate 910 is made of, but not limited to, at least one of the following materials: silicon, silicon carbide, glass, sapphire, spinel, gallium arsenide and gallium nitride.

In this embodiment, the film 920 includes, but is not limited to, a polycrystalline film. In this embodiment, the polycrystalline film is made of, but not limited to, at least one of the following materials: polycrystal grainline silicon, polycrystal grainline silicon nitride and polycrystal grainline silicon carbide. It should be noted that the film 920 can prevent a free electron layer from being formed on the surface of the substrate 910, so that the radio frequency loss of the substrate 910 is reduced In this embodiment, the intermediate layer 930 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 930 is, but not limited to, 0.1 μm-10 μm.

In this embodiment, the acoustic impedance of the material of the electrode layer 961 is greater than that of the material of the electrode layer 962. In this embodiment, the electrical conductivity of the material of the electrode layer 962 is higher than that of the material of the electrode layer 961. In this embodiment, the electrode layer 961 is made of, but not limited to, at least one of the following materials: ruthenium, molybdenum, tungsten, platinum and iridium. In this embodiment, the electrode layer 962 is made of, but not limited to, at least one of the following materials: aluminum and beryllium.

In this embodiment, the piezoelectric layer 970 is a flat layer and covers the upper surface of the intermediate layer 930. In this embodiment, the piezoelectric layer 970 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 970 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 970 comprises multiple crystal grains, wherein the FWHM of a rocking curve of a crystal formed by the multiple crystal grains is less than 2.5°.

It should be noted that the piezoelectric layer 970 formed on a plane does not comprise distinctly turning crystal grains, so that the electro-mechanical coupling factor and Q value of the resonance device are increased.

In this embodiment, the acoustic impedance of the material of the electrode layer 981 is greater than that of the material of the electrode layer 982. In this embodiment, the electrical conductivity of the material of the electrode layer 982 is higher than that of the material of the electrode layer 981. In this embodiment, the electrode layer 981 is made of, but not limited to, at least one of the following materials: ruthenium, molybdenum, tungsten, platinum and iridium. In this embodiment, the electrode layer 982 is made of, but not limited to, at least one of the following materials: aluminum and beryllium.

In this embodiment, a part, overlapping with the electrode 980, of the electrode 960 is located in the cavity 940, and a part, overlapping with the electrode 960, of the electrode 980 is located over the cavity 940.

It should be noted that the electrical conductivity of the electrode layer 962 and the electrode layer 982 is high, so that the resistance of the electrode 960 and the electrode 980 is reduced, and electrical losses are reduced. In addition, an acoustic impedance difference is formed between the electrode layer 961 and the electrode layer 962, and an acoustic impedance difference is formed between the electrode layer 981 and the electrode layer 982, so that leaky waves can be blocked.

Figure 10:
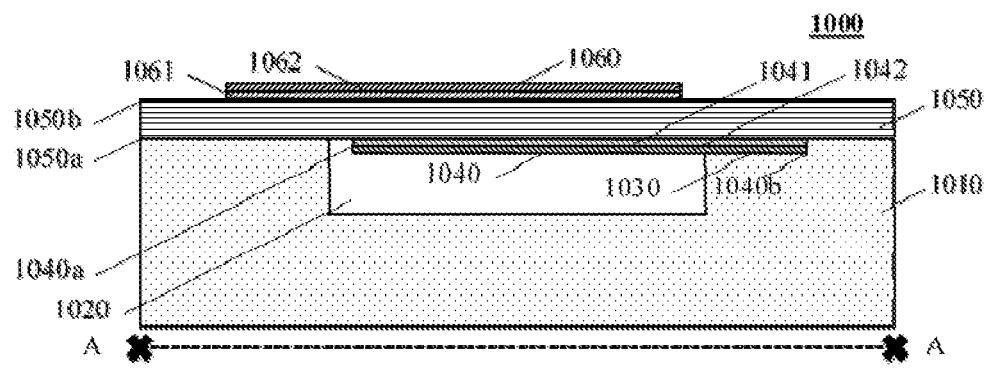
FIG. 10 is a structural diagram of cross-section A of a BAW resonance device 1000 in an embodiment of the invention.

FIG. 10 is a structural diagram of cross-section A of a BAW resonance device 1000 in an embodiment of the invention.

As shown in FIG. 10, an embodiment of the invention provides a BAW resonance device 1000 which comprises a support layer 1010, an electrode 1040, a piezoelectric layer 1050 and an electrode 1060, wherein a cavity 1020 and a groove 1030 are formed in the upper surface of the support layer 1010, the groove 1030 is located on one of the left and right sides of the cavity 1020 and is communicated with the cavity 1020, and the depth of the groove 1030 is smaller than that of the cavity 1020; a first terminal 1040a of the electrode 1040 is located in the cavity 1020, a second terminal 1040b of the electrode 1040 is located in the groove 1030, and the depth of the groove 1030 is equal to the thickness of the electrode 1040; the piezoelectric layer 1050 is located on the electrode 1040, covers the cavity 1020 and has a first side 1050a and a second side 1050b opposite to the first side 1050a, and the electrode 1040 is located on the first side 1050a; and the electrode 1060 is located on the second side 1050b and is disposed on the piezoelectric layer 1050. As can be seen from FIG. 10, a resonance region (namely, an overlap region of the electrode 1040 and the electrode 1060) is suspended with respect to the cavity 1020 and does not overlap with the support layer 1010. Wherein, the electrode 1040 comprises an electrode layer 1041 and an electrode layer 1042, wherein the electrode layer 1041 is located on the first side 1050a and contacts with the piezoelectric layer 1050, the electrode layer 1042 is located on the first side 1050a and contacts with the electrode layer 1041, and the electrode layer 1042 and the piezoelectric layer 1050 are located on two sides of the electrode layer 1041 respectively. The electrode 1060 comprises an electrode layer 1061 and an electrode layer 1062, wherein the electrode layer 1061 is located on the second side 1050b and contacts with the piezoelectric layer 1050, the electrode layer 1062 is located on the second side 1050b and contacts with the piezoelectric layer 1061, and the piezoelectric layer 1050 and the electrode layer 1062 are located on two sides of the electrode layer 1061 respectively.

In this embodiment, the support layer 1010 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 530 is, but not limited to, 20 μm-100 μm.

In this embodiment, the acoustic impedance of the material of the electrode layer 1041 is greater than that of the material of the electrode layer 1042. In this embodiment, the electrical conductivity of the material of the electrode layer 1042 is higher than that of the material of the electrode layer 1041. In this embodiment, the electrode layer 1041 is made of, but not limited to, at least one of the following materials: ruthenium, molybdenum, tungsten, platinum and iridium. In this embodiment, the electrode layer 1042 is made of, but not limited to, at least one of the following materials: aluminum and beryllium.

In this embodiment, the piezoelectric layer 1050 is a flat layer and covers the upper surface of the intermediate layer 1010. In this embodiment, the piezoelectric layer 1050 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 1050 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 1050 comprises multiple crystal grains, wherein the FWHM of a rocking curve of a crystal formed by the multiple crystal grains is less than 2.5°.

It should be noted that the piezoelectric layer 1050 formed on a plane does not comprise distinctly turning crystal grains, so that the electro-mechanical coupling factor and Q value of the resonance device are increased.

In this embodiment, the acoustic impedance of the material of the electrode layer 1061 is greater than that of the material of the electrode layer 1062. In this embodiment, the electrical conductivity of the material of the electrode layer 1062 is higher than that of the material of the electrode layer 1061. In this embodiment, the electrode layer 1061 is made of, but not limited to, at least one of the following materials: ruthenium, molybdenum, tungsten, platinum and iridium. In this embodiment, the electrode layer 1062 is made of, but not limited to, at least one of the following materials: aluminum and beryllium.

In this embodiment, a part, overlapping with the electrode 1060, of the electrode 1040 is located in the cavity 1020, and a part, overlapping with the electrode 1040, of the electrode 1060 is located over the cavity 1040.

It should be noted that the electrical conductivity of the electrode layer 1042 and the electrode layer 1062 is high, so that the resistance of the electrode 1040 and the electrode 1060 is reduced, and electrical losses are reduced. In addition, an acoustic impedance difference is formed between the electrode layer 1041 and the electrode layer 1042, and an acoustic impedance difference is formed between the electrode layer 1061 and the electrode layer 1062, so that leaky waves can be blocked.

Figure 11:
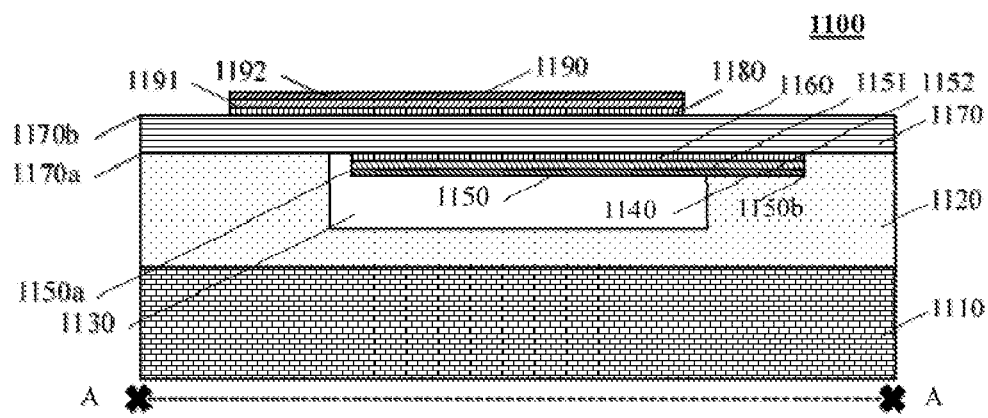
FIG. 11 is a structural diagram of cross-section A of a BAW resonance device 1100 in an embodiment of the invention.

FIG. 11 is a structural diagram of cross-section A of a BAW resonance device 1100 in an embodiment of the invention.

As shown in FIG. 11, an embodiment of the invention provides a BAW resonance device 1100 which comprises a substrate 1110, an intermediate layer 1120, an electrode 1150, a barrier 1160, a piezoelectric layer 1170, a barrier 1180 and an electrode 1190, wherein the intermediate layer 1120 is located on the substrate 1110 and is used to block leaky waves, a cavity 1130 and a groove 1140 are formed in the upper surface of the intermediate layer 1120, the groove 1140 is located on one of the left and right sides of the cavity 1130 and is communicated with the cavity 1130, and the depth of the groove 1140 is smaller than that of the cavity 1130; a first terminal 1150a of the electrode 1150 is located in the cavity 1130, and a second terminal 1150b of the electrode 1150 is located in the groove 1140; the barrier 1160 is located over the cavity 1150, and the depth of the groove 1140 is equal to the sum of the thickness of the electrode 1150 and the thickness of the barrier 1160; the piezoelectric layer 1170 is located on the barrier 1160, covers the cavity 1130 and has a first side 1170a and a second side 1170b opposite to the first side 1170a, the intermediate layer 1120 is located on the first side 1170a, the electrode 1150 is located on the first side 1170a, and the barrier 1160 is located on the first side 1170a; the barrier 1180 is located on the second side 1170b and is disposed on the piezoelectric layer 1170; and the electrode 1190 is located on the second side 1170b and is disposed on the barrier 1180. As can be seen from FIG. 11, a resonance region (namely, an overlap region of the electrode 1150 and the electrode 1190) is suspended with respect to the cavity 1130 and does not overlap with the intermediate layer 1120. Wherein, the electrode 1150 comprises an electrode layer 1151 and an electrode layer 1152, wherein the electrode layer 1151 is located on the first side 1170a and contacts with the barrier 1160, the electrode layer 1152 is located on the first side 1170a and contacts with the electrode layer 1151, and the electrode layer 1152 and the barrier 1160 are located on two sides of the electrode layer 1151 respectively. Wherein, the electrode 1190 comprises an electrode layer 1191 and an electrode layer 1192, wherein the electrode layer 1191 is located on the second side 1170*b* and contacts with the barrier 1180, the electrode layer 1192 is located on the second side 1170*b* and contacts with the electrode layer 1191, and the barrier 1180 and the electrode layer 1192 are located on two sides of the electrode layer 1191 respectively.

In this embodiment, the substrate 1110 is made of, but not limited to, at least one of the following materials: silicon, silicon carbide, glass, sapphire, spinel, gallium arsenide and gallium nitride.

In this embodiment, the intermediate layer 1120 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 1120 is, but not limited to, 0.1 μm-10 μm.

In this embodiment, the acoustic impedance of the material of the electrode layer 1152 is greater than that of the material of the electrode layer 1151. In this embodiment, the electrical conductivity of the material of the electrode layer 1151 is higher than that of the material of the electrode layer 1152. In this embodiment, the electrode layer 1152 is made of, but not limited to, at least one of the following materials: ruthenium, molybdenum, tungsten, platinum and iridium. In this embodiment, the electrode layer 1151 is made of, but not limited to, at least one of the following materials: aluminum and beryllium.

In this embodiment, the barrier 1160 is made of, but not limited to, at least one of the following materials: tungsten, tungsten nitride, titanium nitride, cobalt, ruthenium, tantalum, tantalum nitride and indium oxide. In this embodiment, the thickness of the barrier 1160 is, but not limited to, 30 μm-50 μm. It should be noted that the barrier 1160 is used to prevent chemical reactions between electrode materials and piezoelectric materials, which may otherwise affect electrical properties. Other diffusion barrier materials known by those skilled in the art can also be applied to the embodiment of the invention. In addition, the thickness of the diffusion barrier is smaller than that of the electrodes. In this embodiment, the acoustic impedance of the barrier 1160 is greater than that of the electrode layer 1151.

In this embodiment, the piezoelectric layer 1170 is a flat layer and covers the upper surface of the intermediate layer 1120. In this embodiment, the piezoelectric layer 1170 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the material of the piezoelectric layer 1170 is mixed with a rare earth element, wherein the rare earth element includes, but is not limited to, at least one of scandium, lanthanum and yttrium. It should be noted that the rare earth element mixed in the piezoelectric material can replace a certain proportion of atoms of one element in the piezoelectric material to form a longer chemical bond to generate a pressure. For example, scandium can be mixed in aluminum nitride to replace a certain proportion of aluminum atoms with scandium atoms, and the number of nitrogen atoms remains unchanged, so that a scandium-nitrogen bond longer than an aluminum-nitrogen bond is formed to generate a pressure, and a higher piezoelectric constant and a higher electro-mechanical coupling factor are obtained.

Wherein, the certain proportion refers to the ratio of the number of the scandium atoms to the total number of the scandium atoms and the aluminum atoms and ranges from 3% to 40%.

In this embodiment, the piezoelectric layer 1170 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 1170 comprises multiple crystal grains, wherein the FWHM of a rocking curve of a crystal of the multiple crystal grains is less than 2.5°.

It should be noted that the piezoelectric layer 1170 formed on a plane does not comprise distinctly turning crystal grains, so that the electro-mechanical coupling factor and Q value of the resonance device are increased.

In this embodiment, the barrier 1180 is made of, but not limited to, at least one of the following materials: tungsten, tungsten nitride, titanium nitride, cobalt, ruthenium, tantalum, tantalum nitride and indium oxide. In this embodiment, the thickness of the barrier 1180 is, but not limited to, 30 µm-50 µm. It should be noted that other diffusion barrier materials known by those skilled in the art can also be applied to the embodiment of the invention. In this embodiment, the acoustic impedance of the barrier 1180 is greater than that of the electrode layer 1191.

In this embodiment, the acoustic impedance of the material of the electrode layer 1192 is greater than that of the material of the electrode layer 1191. In this embodiment, the electrical conductivity of the material of the electrode layer 1191 is higher than that of the material of the electrode layer 1192. In this embodiment, the electrode layer 1192 is made of, but not limited to, at least one of the following materials: ruthenium, molybdenum, tungsten, platinum and iridium. In this embodiment, the electrode layer 1191 is made of, but not limited to, at least one of the following materials: aluminum and beryllium.

In this embodiment, a part, overlapping with the electrode 1190, of the electrode 1150 is located in the cavity 1130, and a part, overlapping with the electrode 1150, of the electrode 1190 is located over the cavity 1130.

It should be noted that the electrical conductivity of the electrode layer 1151 and the electrode layer 1191 is high, so that the resistance of the electrode 1150 and the electrode 1190 is reduced, and electrical losses are reduced. In addition, an acoustic impedance difference is formed between the electrode layer 1151 and the electrode layer 1152, and an acoustic impedance difference is formed between the electrode layer 1191 and the electrode layer 1192, so that leaky waves can be blocked. Moreover, the electrode layer 1151 and the electrode layer 1191 have low acoustic attenuation, so that the acoustic loss is low. Furthermore, the electrode layer 1151 and the electrode layer 1191 have high thermal conductivity, so that the heat dissipation capacity of the resonance device is improved.

Figure 12:
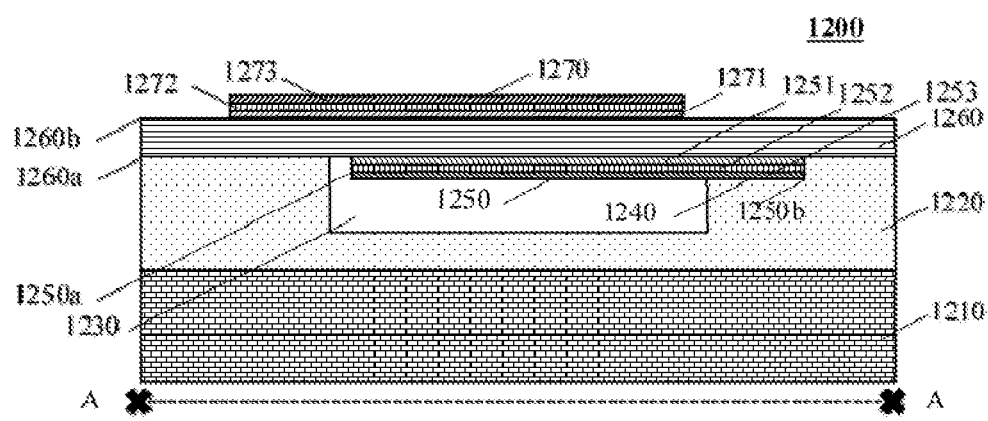
FIG. 12 is a structural diagram of cross-section A of a BAW resonance device 1200 in an embodiment of the invention.

FIG. 12 is a structural diagram of cross-section A of a BAW resonance device 1200 in an embodiment of the invention.

As shown in FIG. 12, an embodiment of the invention provides a BAW resonance device 1200 which comprises a substrate 1210, an intermediate layer 1220, an electrode 1250, a piezoelectric layer 1260 and an electrode 1270, wherein the intermediate layer 1220 is located on the substrate 1210 and is used to block leaky waves, a cavity 1230 and a groove 1240 are formed in the upper surface of the intermediate layer 1220, the groove 1240 is located on one of the left and right sides of the cavity 1230 and is communicated with the cavity 1230, and the depth of the groove 1240 is smaller than that of the cavity 1230; a first terminal 1250*a* of the electrode 1250 is located in the cavity 1230, a second terminal 1250*b* of the electrode 1250 is located in the groove 1240, and the depth of the groove 1240 is equal to the thickness of the electrode 1250; the piezoelectric layer 1260 is located on the electrode 1250, covers the cavity 1230 and has a first side 1260*a* and a second side 1260*b* opposite to the first side 1260*a*, the intermediate layer 1220 is located on the first side 1260*a*, and the electrode 1250 is also located on the first side 1260*a*; and the electrode 1270 is located on the second side 1260*b* and is disposed on the piezoelectric layer 1260. As can be seen from FIG. 12, a resonance region (namely, an overlap region of the electrode 1250 and the electrode 1270) is suspended with respect to the cavity 1230 and does not overlap with the intermediate layer 1220. Wherein, the electrode 1250 comprises an electrode layer 1251, a dielectric layer 1252 and an electrode layer 1253, wherein the electrode layer 1251 is located on the first side 1260*a* and contacts with the piezoelectric layer 1260, the dielectric layer 1252 is located on the first side 1260*a* and contacts with the electrode layer 1251, the electrode layer 1253 is located on the first side 1260*a* and contacts with the dielectric layer 1252, and the electrode layer 1253 and the electrode layer 1251 are located on two sides of the dielectric layer 1252 respectively. Wherein, the electrode 1270 comprises an electrode layer 1271, a dielectric layer 1272 and an electrode layer 1273, wherein the electrode layer 1271 is located on the second side 1260*b* and contacts with the piezoelectric layer 1260, the dielectric layer 1272 is located on the second side 1260*b* and contacts with the electrode layer 1271, the electrode layer 1273 is located on the second side 1260*b* and contacts with the dielectric layer 1272, and the electrode layer 1271 and the electrode layer 1273 are located on two sides of the dielectric layer 1272 respectively.

In this embodiment, the substrate 1210 is made of, but not limited to, at least one of the following materials: silicon, silicon carbide, glass, sapphire, spinel, gallium arsenide and gallium nitride.

In this embodiment, the intermediate layer 1220 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 1220 is, but not limited to, 0.1 µm-10 µm.

In this embodiment, the acoustic impedance of the material of the electrode layer 1251 is greater than that of the material of the electrode layer 1253. In this embodiment, the electrical conductivity of the material of the electrode layer 1253 is higher than that of the material of the electrode layer 1251. In this embodiment, the acoustic impedance of the dielectric layer 1252 is smaller than that of the electrode layer 1253. In this embodiment, the electrode layer 1251 is made of, but not limited to, at least one of the following materials: ruthenium, molybdenum, tungsten, platinum and iridium. In this embodiment, the dielectric layer 1252 is made of, but not limited to, at least one of the following materials: silicon dioxide, silicon oxycarbide, silicon nitride, aluminum nitride, titanium oxide, hafnium oxide and aluminum oxide. In this embodiment, the electrode layer 1253 is made of, but not limited to, at least one of the following materials: aluminum and beryllium.

In this embodiment, the piezoelectric layer 1260 is a flat layer and covers the upper surface of the intermediate layer 1220. In this embodiment, the piezoelectric layer 1260 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 1260 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In this embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 1260 comprises multiple crystal grains, wherein the FWHM of a rocking curve of a crystal formed by the multiple crystal grains is less than 2.5°.

It should be noted that the piezoelectric layer 1260 formed on a plane does not comprise distinctly turning crystal grains, so that the electro-mechanical coupling factor and Q value of the resonance device are increased.

In this embodiment, the acoustic impedance of the material of the electrode layer 1271 is greater than that of the material of the electrode layer 1273. In this embodiment, the electrical conductivity of the material of the electrode layer 1273 is higher than that of the material of the electrode layer 1271. In this embodiment, the acoustic impedance of the dielectric layer 1272 is smaller than that of the electrode layer 1273. In this embodiment, the electrode layer 1271 is made of, but not limited to, at least one of the following materials: ruthenium, molybdenum, tungsten, platinum and iridium. In this embodiment, the dielectric layer 1272 is made of, but not limited to, at least one of the following materials: silicon dioxide, silicon oxycarbide, silicon nitride, aluminum nitride, titanium oxide, hafnium oxide and aluminum oxide. In this embodiment, the electrode layer 1273 is made of, but not limited to, at least one of the following materials: aluminum and beryllium.

In this embodiment, a part, overlapping with the electrode 1270, of the electrode 1250 is located in the cavity 1230, and a part, overlapping with the electrode 1250, of the electrode 1270 is located above the cavity 1230.

It should be noted that the electrical conductivity of the electrode layer 1253 and the electrode layer 1273 is high, so that the resistance of the electrode 1250 and the electrode 1270 is reduced, and electrical losses are reduced. In addition, the acoustic impedance of the dielectric layer 1252 is smaller than that of the electrode layer 1251 and the electrode layer 1253, and the acoustic impedance of the dielectric layer 1272 is smaller than that of the electrode layer 1271 and the electrode layer 1273, so that leaky waves can be blocked.

Figure 13:
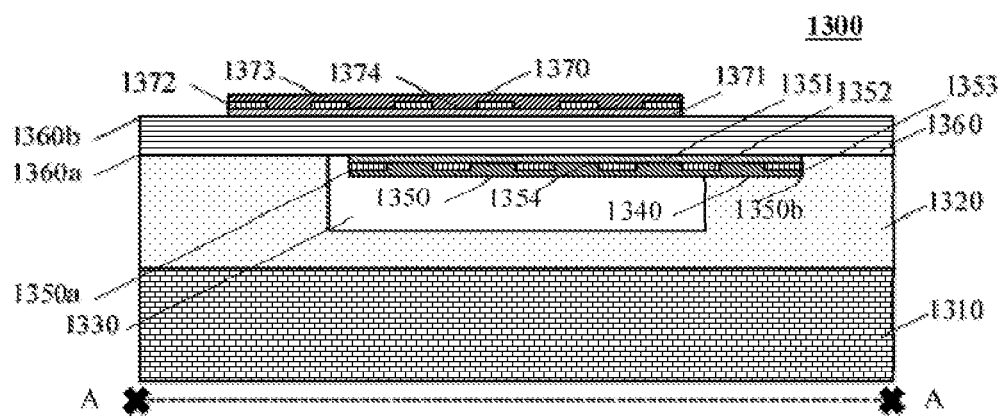
FIG. 13 is a structural diagram of cross-section A of a BAW resonance device 1300 in an embodiment of the invention.

FIG. 13 is a structural diagram of cross-section A of a BAW resonance device 1300 in an embodiment of the invention.

As shown in FIG. 13, an embodiment of the invention provides a BAW resonance device 1300 which comprises a substrate 1310, an intermediate layer 1320, an electrode 1350, a piezoelectric layer 1360 and an electrode 1370, wherein the intermediate layer 1320 is located on the substrate 1310 and is used to block leaky waves, a cavity 1330 and a groove 1340 are formed in the upper surface of the intermediate layer 1320, the groove 1340 is located on one of the left and right sides of the cavity 1330 and is communicated with the cavity 1330, and the depth of the groove 1340 is smaller than that of the cavity 1330; a first terminal 1350a of the electrode 1350 is located in the cavity 1330, a second terminal 1350b of the electrode 1350 is located in the groove 1340, and the depth of the groove 1340 is equal to the thickness of the electrode 1350; the piezoelectric layer 1360 is located on the electrode 1350, covers the cavity 1330 and has a first side 1360a and a second side 1360b opposite to the first side 1360a, the intermediate layer 1320 is located on the first side 1360a, and the electrode 1350 is also located on the first side 1360a; and the electrode 1370 is located on the second side 1360b and is disposed on the piezoelectric layer 1360. As can be seen from FIG. 13, a resonance region (namely, an overlap region of the electrode 1350 and the electrode 1370) is suspended with respect to the cavity 1330 and does not overlap with the intermediate layer 1320. Wherein, the electrode 1350 comprises an electrode layer 1351, a dielectric layer 1352 and an electrode layer 1354, wherein the electrode layer 1351 is located on the first side 1360a and contacts with the piezoelectric layer 1360, the dielectric layer 1352 is located on the first side 1360a and contacts with the electrode layer 1351, and the dielectric layer 1352 comprises at least one through hole 1353; the electrode layer 1354 is located on the first side 1360a, is inlaid in the at least one through hole 1353 and covers the dielectric layer 1352; and the electrode layer 1351 and the electrode layer 1354 are located on two sides of the dielectric layer 1352 respectively, and the electrode layer 1354 contacts with the electrode layer 1351 through the at least one through hole 1353. Wherein, the electrode 1370 comprises an electrode layer 1371, a dielectric layer 1372 and an electrode layer 1374, wherein the electrode layer 1371 is located on the second side 1360b and contacts with the piezoelectric layer 1360; the dielectric layer 1372 is located on the second side 1360b and contacts with the electrode layer 1371; the dielectric layer 1372 comprises at least one through hole 1373; the electrode layer 1374 is located on the second side 1360b, is inlaid in the at least one through hole 1373 and covers the dielectric layer 1372; and the electrode layer 1371 and the electrode layer 1374 are located on two sides of the dielectric layer 1372 respectively, and the electrode layer 1374 contacts with the electrode layer 1371 through the at least one through hole 1373.

In this embodiment, the substrate 1310 is made of, but not limited to, at least one of the following materials: silicon, silicon carbide, glass, sapphire, spinel, gallium arsenide and gallium nitride.

In this embodiment, the intermediate layer 1320 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 1320 is, but not limited to, 0.1 μm-10 μm.

In this embodiment, the acoustic impedance of the material of the electrode layer 1351 is greater than that of the material of the electrode layer 1353. In this embodiment, the electrical conductivity of the material of the electrode layer 1353 is higher than that of the material of the electrode layer 1351. In this embodiment, the acoustic impedance of the dielectric layer 1352 is smaller than that of the electrode layer 1353. In this embodiment, the electrode layer 1351 is made of, but not limited to, at least one of the following materials:

ruthenium, molybdenum, tungsten, platinum and iridium. In this embodiment, the dielectric layer 1352 is made of, but not limited to, at least one of the following materials: silicon dioxide, silicon oxycarbide, silicon nitride, aluminum nitride, titanium oxide, hafnium oxide and aluminum oxide.

In this embodiment, the electrode layer 1353 is made of, but not limited to, at least one of the following materials: aluminum and beryllium.

In this embodiment, the piezoelectric layer 1360 is a flat layer and covers the upper surface of the intermediate layer 1320. In this embodiment, the piezoelectric layer 1360 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 1360 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 1360 comprises multiple crystal grains, wherein the FWHM of a rocking curve of a crystal of the multiple crystal grains is less than 2.5°.

It should be noted that the piezoelectric layer 1360 formed on a plane does not comprise distinctly turning crystal grains, so that the electro-mechanical coupling factor and Q value of the resonance device are increased.

In this embodiment, the acoustic impedance of the material of the electrode layer 1371 is greater than that of the material of the electrode layer 1373. In this embodiment, the electrical conductivity of the material of the electrode layer 1373 is higher than that of the material of the electrode layer 1371. In this embodiment, the acoustic impedance of the dielectric layer 1372 is smaller than that of the electrode layer 1373. In this embodiment, the electrode layer 1371 is made of, but not limited to, at least one of the following materials: ruthenium, molybdenum, tungsten, platinum and iridium. In this embodiment, the dielectric layer 1372 is made of, but not limited to, at least one of the following materials: silicon dioxide, silicon oxycarbide, silicon nitride, aluminum nitride, titanium oxide, hafnium oxide and aluminum oxide. In this embodiment, the electrode layer 1373 is made of, but not limited to, at least one of the following materials: aluminum and beryllium.

In this embodiment, a part, overlapping with the electrode 1370, of the electrode 1350 is located in the cavity 1330, and a part, overlapping with the electrode 1350, of the electrode 1370 is located above the cavity 1330.

It should be noted that the electrical conductivity of the electrode layer 1353 and the electrode layer 1373 is high, so that the resistance of the electrode 1350 and the electrode 1370 is reduced, and electrical losses are reduced. In addition, the acoustic impedance of the dielectric layer 1352 is smaller than that of the electrode layer 1351 and the electrode layer 1353, and the acoustic impedance of the dielectric layer 1372 is smaller than that of the electrode layer 1371 and the electrode layer 1373, so that leaky waves can be blocked.

Figure 14:
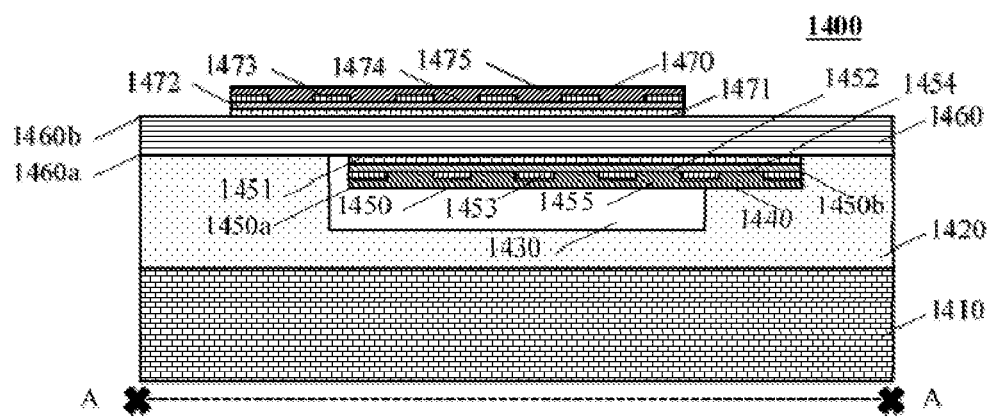
FIG. 14 is a structural diagram of cross-section A of a BAW resonance device 1400 in an embodiment of the invention.

FIG. 14 is a structural diagram of cross-section A of a BAW resonance device 1400 in an embodiment of the invention.

As shown in FIG. 14, an embodiment of the invention provides a BAW resonance device 1400 which comprises a substrate 1410, an intermediate layer 1420, an electrode layer 1450, a barrier 1460, a piezoelectric layer 1470, a barrier 1480 and an electrode 1490, wherein the intermediate layer 1420 is located on the substrate 1410 and is used to block leaky waves, a cavity 1430 and a groove 1440 are formed in the upper surface of the intermediate layer 1420, the groove 1440 is located on one of the left and right sides of the cavity 1430 and is communicated with the cavity 1430, and the depth of the groove 1440 is smaller than that of the cavity 1430; a first terminal 1450*a* of the electrode 1450 is located in the cavity 1430, and a second terminal 1450*b* of the electrode 1450 is located in the groove 1440; the barrier 1460 is located on the electrode 1450, and the depth of the groove 1440 is equal to the sum of the thickness of the electrode 1450 and the thickness of the barrier 1460; the piezoelectric layer 1470 is located on the barrier 1460, covers the cavity 1430 and has a first side 1470*a* and a second side 1470*b* opposite to the first side 1470*a*, the intermediate layer 1420 is located on the first side 1470*a*, the electrode 1450 is located on the first side 1470*a*, and the barrier 1460 is also located on the first side 1470*a*; the barrier 1480 is located on the second side 1470*b* and is disposed on the piezoelectric layer 1470; and the electrode 1490 is located on the second side 1470*b* and is disposed on the barrier 1480. As can be seen from FIG. 14, a resonance region (namely, an overlap region of the electrode 1450 and the electrode 1490) is suspended with respect to the cavity 1430 and does not overlap with the intermediate layer 1420. The electrode 1450 comprises an electrode layer 1451, a dielectric layer 1452 and an electrode layer 1454, wherein the electrode layer 1451 is located on the first side 1470*a* and contacts with the barrier 1460; the dielectric layer 1452 is located on the first side 1470*a* and contacts with the electrode layer 1451, and the dielectric layer 1452 comprises at least one through hole 1453; the electrode layer 1454 is located on the first side 1470*a*, is inlaid in the at least one through hole 1453 and covers the dielectric layer 1452; the electrode layer 1451 and the electrode layer 1454 are located on two sides of the dielectric layer 1452 respectively, and the electrode layer 1454 contacts with the electrode layer 1451 through the at least one through hole 1453. Wherein, the electrode 1490 comprises an electrode layer 1491, a dielectric layer 1492 and an electrode layer 1494, wherein the electrode layer 1491 is located on the second side 1470*b* and contacts with the barrier 1480; the dielectric layer 1492 is located on the second side 1470*b*, contacts with the electrode layer 1491 and comprises at least one through hole 1493; the electrode layer 1494 is located on the second side 1470*b*, is inlaid in the at least one through hole 1493 and covers the dielectric layer 1492; and the electrode layer 1491 and the electrode layer 1494 are located on two sides of the dielectric layer 1492 respectively, and the electrode layer 1494 contacts with the electrode layer 1491 through the at least one through hole 1493.

In this embodiment, the substrate 1410 is made of, but not limited to, at least one of the following materials: silicon, silicon carbide, glass, sapphire, spinel, gallium arsenide and gallium nitride.

In this embodiment, the intermediate layer 1420 is made of, but not limited to, at least one of the following materials: polymer, insulating dielectric and polysilicon. In this embodiment, the polymer includes, but is not limited to, at least one of benzocyclobutene (BCB), photosensitive epoxy resin photoresist (such as SU-8) and polyimide. In this embodiment, the insulating dielectric includes, but is not limited to, at least one of aluminum nitride, silicon dioxide, silicon nitride and titanium oxide. In this embodiment, the thickness of the intermediate layer 1420 is, but not limited to, 0.1 μm-10 μm.

In this embodiment, the acoustic impedance of the material of the electrode layer 1451 is greater than that of the material of the electrode layer 1453. In this embodiment, the electrical conductivity of the material of the electrode layer 1453 is higher than that of the material of the electrode layer 1451. In this embodiment, the acoustic impedance of the dielectric layer 1452 is smaller than that of the electrode layer 1453. In this embodiment, the electrode layer 1451 is made of, but not limited to, at least one of the following materials: ruthenium, molybdenum, tungsten, platinum and iridium. In this embodiment, the dielectric layer 1452 is made of, but not limited to, at least one of the following materials: silicon dioxide, silicon oxycarbide, silicon nitride, aluminum nitride, titanium oxide, hafnium oxide and aluminum oxide. In this embodiment, the electrode layer 1453 is made of, but not limited to, at least one of the following materials: aluminum and beryllium.

In this embodiment, the barrier 1460 is made of, but not limited to, at least one of the following materials: tungsten, tungsten nitride, titanium nitride, cobalt, ruthenium, tantalum, tantalum nitride and indium oxide. In this embodiment, the thickness of the barrier 1460 is, but not limited to, 30 µm-50 µm. It should be noted that the barrier 1460 is used to prevent chemical reactions between electrode materials and piezoelectric materials, which may otherwise affect electrical properties. It should be noted that other diffusion barrier materials known by those skilled in the art can also be applied to the embodiment of the invention. In addition, the thickness of the diffusion barrier is smaller than that of the electrodes. In this embodiment, the acoustic impedance of the barrier 1460 is greater than that of the electrode layer 1451.

In this embodiment, the piezoelectric layer 1470 is a flat layer and covers the upper surface of the intermediate layer 1420. In this embodiment, the piezoelectric layer 1470 is made of, but not limited to, at least one of the following materials: aluminum nitride, aluminum oxide alloy, gallium nitride, zinc oxide, lithium tantalite, lithium niobate, lead zirconate titanate, and lead magnesium niobate-lead titanate.

In this embodiment, the piezoelectric layer 1470 comprises multiple crystal grains, and the multiple crystal grains include a first crystal grain and a second crystal grain, wherein the first crystal grain and the second crystal grain are any two crystal grains of the multiple crystal grains. As is known to those skilled in the art, the orientation and plane of crystal grains can be represented by coordinate systems.

In this embodiment, the first crystal grain may be represented by a first three-dimensional coordinate system, and the second crystal grain may be represented by a second three-dimensional coordinate system, wherein the first three-dimensional coordinate system at least includes a first coordinate axis in a first direction and a third coordinate axis in a third direction, the second three-dimensional coordinate system at least includes a second coordinate axis in a second direction and a fourth coordinate axis in a fourth direction, the first coordinate axis corresponds to the height of the first crystal grain, and the second coordinate axis corresponds to the height of the second crystal grain.

In this embodiment, the first direction is identical with or opposite to the second direction. It should be noted that when the first direction is identical with the second direction, an angle between a vector in the first direction and a vector in the second direction ranges from 0° to 5°, and that when the first direction is opposite to the second direction, the angle between the vector in the first direction and the vector in the second direction ranges from 175° to 180°.

In another embodiment, the first three-dimensional coordinate system is an ac three-dimensional coordinate system, wherein the first coordinate axis is a first c-axis, and the third coordinate axis is a first a-axis; and the second three-dimensional coordinate system is also an ac three-dimensional coordinate system, wherein the second coordinate axis is a second c-axis, the fourth coordinate axis is a second a-axis, and the first c-axis and the second c-axis are in the same direction or in opposite directions.

In another embodiment, the first three-dimensional coordinate system further includes a fifth coordinate axis in a fifth direction, and the second three-dimensional coordinate system further includes a sixth coordinate axis in a sixth direction. In another embodiment, the first direction is identical with or opposite to the second direction, and the third direction is identical with or opposite to the fourth direction. It should be noted that when the third direction is identical with the fourth direction, an angle between a vector in the third direction and a vector in the fourth direction ranges from 0° to 5°, and that when the third direction is opposite to the fourth direction, the angle between the vector in the third direction and the vector in the fourth direction ranges from 175° to 180°.

In another embodiment, the first three-dimensional coordinate system is an xyz three-dimensional coordinate system, wherein the first coordinate axis is a first z-axis, the third coordinate axis is a first y-axis, and the fifth coordinate axis is a first x-axis; and the second three-dimensional coordinate system is also an xyz three-dimensional coordinate system, wherein the second coordinate axis is a second z-axis, the fourth coordinate axis is a second y-axis, and the sixth coordinate axis is a second x-axis. In another embodiment, the first z-axis and the second z-axis are in the same direction, and the first y-axis and the second y-axis are in the same direction. In another embodiment, the first z-axis and the second z-axis are in opposite directions, and the first y-axis and the second y-axis are in opposite directions. In another embodiment, the first z-axis and the second z-axis are in the same direction, and the first y-axis and the second y-axis are in opposite directions. In another embodiment, the first z-axis and the second z-axis are in opposite directions, and the first y-axis and the second y-axis are in the same direction.

In this embodiment, the piezoelectric layer 1470 comprises multiple crystal grains, wherein the FWHM of a rocking curve of a crystal formed by the multiple crystal grains is less than 2.5°.

It should be noted that the piezoelectric layer 1470 formed on a plane does not comprise distinctly turning crystal grains, so that the electro-mechanical coupling factor and Q value of the resonance device are increased.

In this embodiment, the barrier 1480 is made of, but not limited to, at least one of the following materials: tungsten, tungsten nitride, titanium nitride, cobalt, ruthenium, tantalum, tantalum nitride and indium oxide. In this embodiment, the thickness of the barrier 1480 is, but not limited to, 30 µm-50 µm. It should be noted that the barrier 1480 is used to prevent chemical reactions between electrode materials and piezoelectric materials, which may otherwise affect electrical properties. It should be noted that other diffusion barrier materials known by those skilled in the art can also be applied to the embodiment of the invention. In addition, the thickness of the diffusion barrier is smaller than that of the electrodes. In this embodiment, the acoustic impedance of the barrier 1480 is greater than that of the electrode layer 1491.

In this embodiment, the acoustic impedance of the material of the electrode layer 1491 is greater than that of the material of the electrode layer 1493. In this embodiment, the electrical conductivity of the material of the electrode layer 1493 is higher than that of the material of the electrode layer 1491. In this embodiment, the acoustic impedance of the dielectric layer 1492 is smaller than that of the electrode layer 1493. In this embodiment, the electrode layer 1491 is made of, but not limited to, at least one of the following materials: ruthenium, molybdenum, tungsten, platinum and iridium. In this embodiment, the dielectric layer 1492 is made of, but not limited to, at least one of the following materials: silicon dioxide, silicon oxycarbide, silicon nitride, aluminum nitride, titanium oxide, hafnium oxide and aluminum oxide. In this embodiment, the electrode layer 1493 is made of, but not limited to, at least one of the following materials: aluminum and beryllium.

In this embodiment, a part, overlapping with the electrode 1490, of the electrode 1450 is located in the cavity 1430, and a part, overlapping with the electrode 1450, of the electrode 1490 is located over the cavity 1430.

It should be noted that the electrical conductivity of the electrode layer 1453 and the electrode layer 1493 is high, so that the resistance of the electrode 1450 and the electrode 1490 is reduced, and electrical losses are reduced. In addition, the acoustic impedance of the dielectric layer 1452 is smaller than that of the electrode layer 1451 and the electrode layer 1453, and the acoustic impedance of the dielectric layer 1492 is smaller than that of the electrode layer 1491 and the electrode layer 1493, so that leaky waves can be blocked.

To sum up, the BAW resonance device provided by the invention comprises a first electrode (namely, a lower electrode) and a second electrode (namely, an upper electrode), wherein the first electrode comprises a first electrode layer and a second electrode layer, the second electrode comprises a third electrode layer and a fourth electrode layer, the electrical conductivity of the second electrode layer is higher than that of the first electrode, and the electrical conductivity of the fourth electrode layer is higher than that of the third electrode, so that the resistance of the first electrode and the second electrode are reduced, electrical losses are reduced, and the Q value is increased.

It should be understood that the examples and embodiments in this specification are merely illustrative ones, and various modifications and amendments can be made by those skilled in the art without departing from the spirit and scope defined by this application and the appended claims.

The invention claimed is:

1. A BAW resonance device, comprising:
    a first layer comprising a first cavity located on a first side;
    a first electrode having a first terminal located in the first cavity and a second terminal contacting with the first layer;
    a second layer located on the first side and disposed on the first electrode; and
    a second electrode located on the second layer, wherein the first electrode and the second electrode are located on two sides of the second layer;
    wherein, a first part, overlapping with the second electrode, of the first electrode is located in the first cavity;
    wherein, the first electrode comprises a first electrode layer and a second electrode layer, and the second electrode layer and the second layer are located on two sides of the first electrode layer;
    wherein, the second electrode comprises a third electrode layer and a fourth electrode layer, and the second layer and the fourth electrode layer are located on two sides of the third electrode layer; and
    wherein, the first layer further comprises a first groove located on the first side, the first groove is located on a horizontal side of the first cavity and is communicated with the first cavity, and the second terminal is located in the first groove.

2. The BAW resonance device according to claim 1, wherein the first layer further comprises an intermediate layer including the first cavity.

3. The BAW resonance device according to claim 2, wherein the intermediate layer is made of at least one of the following materials: polymer, insulating dielectric and polysilicon.

4. The BAW resonance device according to claim 2, wherein a thickness of the intermediate layer is 0.1 µm-10 µm.

5. The BAW resonance device according to claim 1, wherein the first layer is a support layer that includes the first cavity.

6. The BAW resonance device according to claim 5, wherein the support layer is made of at least one of the following materials: polymer, insulating dielectric and polysilicon.

7. The BAW resonance device according to claim 5, wherein a thickness of the support layer is 20 µm-100 µm.

8. The BAW resonance device according to claim 1, wherein the first layer is a first substrate that includes the first cavity.

9. The BAW resonance device according to claim 1, wherein the acoustic impedance of the first electrode layer is greater than that of the second electrode layer, the electrical conductivity of the first electrode layer is lower than that of the second electrode layer, the acoustic impedance of the third electrode layer is greater than that of the fourth electrode layer, and the electrical conductivity of the third electrode layer is lower than that of the fourth electrode layer.

10. The BAW resonance device according to claim 1, wherein the second layer comprises a piezoelectric layer, and the piezoelectric layer comprises multiple crystal grains including a first crystal grain and a second crystal grain, wherein the first crystal grain and the second crystal grain are any two crystal grains of the multiple crystal grains; a first coordinate axis in a first direction corresponds to a height of the first crystal grain, and a second coordinate axis in a second direction corresponds to a height of the second crystal grain, wherein the first direction is identical with or opposite to the second direction.

11. The BAW resonance device according to claim 10, wherein the first crystal grain corresponds to a first coordinate system which includes the first coordinate axis and a third coordinate axis in a third direction, and the second crystal grain corresponds a second coordinate system which includes the second coordinate axis and a fourth coordinate axis in a fourth direction.

12. The BAW resonance device according to claim 11, wherein the first coordinate system further includes a fifth coordinate axis in a fifth direction, and the second coordinate system further includes a sixth coordinate axis in a sixth direction.

13. The BAW resonance device according to claim 12, wherein the third direction is identical with or opposite to the fourth direction.

14. The BAW resonance device according to claim 10, wherein the piezoelectric layer is made of at least one of the following materials: aluminum nitride, aluminum oxide alloy, gallium nitride, zinc oxide, lithium tantalite, lithium niobate, lead zirconate titanate, and lead magnesium niobate-lead titanate.

15. A BAW resonance device, comprising:
    a first layer comprising a first cavity located on a first side;
    a first electrode having a first terminal located in the first cavity and a second terminal contacting with the first layer;
    a second layer located on the first side and disposed on the first electrode; and a second electrode located on the second layer, wherein the first electrode and the second electrode are located on two sides of the second layer;

wherein, a first part, overlapping with the second electrode, of the first electrode is located in the first cavity;

wherein, the first electrode comprises a first electrode layer and a second electrode layer, and the second electrode layer and the second layer are located on two sides of the first electrode layer;

wherein, the second electrode comprises a third electrode layer and a fourth electrode layer, and the second layer and the fourth electrode layer are located on two sides of the third electrode layer; and wherein, the second layer comprises a piezoelectric layer, the piezoelectric layer comprises multiple crystal grains, and an FWHM of a rocking curve of a crystal formed by the multiple crystal grains is less than 2.5°.

16. The BAW resonance device according to claim 15, wherein the first layer further comprises a first groove located on the first side, the first groove is located on a horizontal side of the first cavity and is communicated with the first cavity, and the second terminal is located in the first groove.

17. The BAW resonance device according to claim 1, wherein the first electrode layer is made of at least one of the following materials: ruthenium, molybdenum, tungsten, platinum and iridium; the second electrode layer is made of at least one of the following materials: aluminum and beryllium; the third electrode layer is made of at least one of the following materials: ruthenium, molybdenum, tungsten, platinum and iridium; and the fourth electrode layer is made of at least one of the following materials: aluminum and beryllium.

18. The BAW resonance device according to claim 1, wherein the acoustic impedance of the first electrode layer is smaller than that of the second electrode layer, the electrical conductivity of the first electrode layer is higher than that of the second electrode layer, the acoustic impedance of the third electrode layer is smaller than that of the fourth electrode layer, and the electrical conductivity of the third electrode layer is greater than that of the fourth electrode layer.

19. The BAW resonance device according to claim 1, wherein the first electrode layer is made of at least one of the following materials: aluminum and beryllium; the second electrode layer is made of at least one of the following materials: ruthenium, molybdenum, tungsten, platinum and iridium; the third electrode layer is made of at least one of the following materials: aluminum and beryllium; and the fourth electrode layer is made of at least one of the following materials: ruthenium, molybdenum, tungsten, platinum and iridium.

20. The BAW resonance device according to claim 1, further comprising a first barrier, wherein the first electrode layer and the second layer are located on two sides of the first barrier, and the acoustic impedance of the first barrier is greater than that of the first electrode layer.

21. The BAW resonance device according to claim 20, wherein the first barrier is made of at least one of the following materials: tungsten, tungsten nitride, titanium nitride, cobalt, ruthenium, tantalum, tantalum nitride and indium oxide.

22. The BAW resonance device according to claim 1, further comprising a second barrier, wherein the second layer and the third electrode layer are located on two sides of the first barrier, and the acoustic impedance of the second barrier is greater than that of the third electrode layer.

23. The BAW resonance device according to claim 22, wherein the second barrier is made of at least one of the following materials: tungsten, tungsten nitride, titanium nitride, cobalt, ruthenium, tantalum, tantalum nitride and indium oxide.

24. A BAW resonance device, comprising:
a first layer comprising a first cavity located on a first side;
a first electrode having a first terminal located in the first cavity and a second terminal contacting with the first layer;
a second layer located on the first side and disposed on the first electrode; and
a second electrode located on the second layer, wherein the first electrode and the second electrode are located on two sides of the second layer;
wherein, a first part, overlapping with the second electrode, of the first electrode is located in the first cavity;
wherein, the first electrode comprises a first electrode layer and a second electrode layer, and the second electrode layer and the second layer are located on two sides of the first electrode layer;
wherein, the second electrode comprises a third electrode layer and a fourth electrode layer, and the second layer and the fourth electrode layer are located on two sides of the third electrode layer; and
wherein, the first electrode further comprises a first dielectric layer, the second electrode layer and the first electrode layer are located on two sides of the first dielectric layer, the acoustic impedance of the first dielectric layer is smaller than that of the first electrode layer, and the acoustic impedance of the first dielectric layer is smaller than that of the second electrode layer.

25. The BAW resonance device according to claim 24, wherein the first dielectric layer is made of at least one of the following materials: silicon dioxide, silicon oxycarbide, silicon nitride, aluminum nitride, titanium oxide, hafnium oxide and aluminum oxide.

26. The BAW resonance device according to claim 24, wherein the first dielectric layer comprises at least one second groove, and the second electrode layer is inlaid in the at least one second groove and covers the first dielectric layer.

27. The BAW resonance device according to claim 1, wherein the second electrode further comprises a second dielectric layer, the third electrode layer and the fourth electrode layer are located on two sides of the second dielectric layer, the acoustic impedance of the second dielectric layer is smaller than that of the third electrode layer, and the acoustic impedance of the second dielectric layer is smaller than that of the fourth electrode layer.

28. The BAW resonance device according to claim 27, wherein the second dielectric layer is made of at least one of the following materials: silicon dioxide, silicon oxycarbide, silicon nitride, aluminum nitride, titanium oxide, hafnium oxide and aluminum oxide.

29. The BAW resonance device according to claim 27, wherein the second dielectric layer comprises at least one third groove, and the fourth electrode layer is inlaid in the at least one third groove and covers the second dielectric layer.

30. The BAW resonance device according to claim 1, further comprising a second substrate located on a second side of the first layer, wherein the second side is opposite to the first side.

31. The BAW resonance device according to claim 30, further comprising a film located between the first layer and the second substrate.

32. The BAW resonance device according to claim 31, wherein the film includes a polycrystalline film.

33. A filter device, comprising at least one BAW resonance device according to claim 1.

34. A filter device, comprising at least one BAW resonance device according to claim 9.

35. A filter device, comprising at least one BAW resonance device according to claim 18.

36. A filter device, comprising at least one BAW resonance device according to claim 24.

37. A filter device, comprising at least one BAW resonance device according to claim 27.

38. An RF front-end device, comprising a power amplification device and at least one filter device according to claim 33, wherein the power amplification device is connected to the filter device.

39. An RF front-end device, comprising a power amplification device and at least one filter device according to claim 34, wherein the power amplification device is connected to the filter device.

40. An RF front-end device, comprising a power amplification device and at least one filter device according to claim 35, wherein the power amplification device is connected to the filter device.

41. An RF front-end device, comprising a power amplification device and at least one filter device according to claim 36, wherein the power amplification device is connected to the filter device.

42. An RF front-end device, comprising a power amplification device and at least one filter device according to claim 37, wherein the power amplification device is connected to the filter device.

43. An RF front-end device, comprising a low-noise amplification device and at least one filter device according to claim 33, wherein the low-noise amplification device is connected to the filter device.

44. An RF front-end device, comprising a low-noise amplification device and at least one filter device according to claim 34, wherein the low-noise amplification device is connected to the filter device.

45. An RF front-end device, comprising a low-noise amplification device and at least one filter device according to claim 35, wherein the low-noise amplification device is connected to the filter device.

46. An RF front-end device, comprising a low-noise amplification device and at least one filter device according to claim 36, wherein the low-noise amplification device is connected to the filter device.

47. An RF front-end device, comprising a low-noise amplification device and at least one filter device according to claim 37, wherein the low-noise amplification device is connected to the filter device.

48. An RF front-end device, comprising a multiplexing device, wherein the multiplexing device comprises at least one filter device according to claim 33.

49. An RF front-end device, comprising a multiplexing device, wherein the multiplexing device comprises at least one filter device according to claim 34.

50. An RF front-end device, comprising a multiplexing device, wherein the multiplexing device comprises at least one filter device according to claim 35.

51. An RF front-end device, comprising a multiplexing device, wherein the multiplexing device comprises at least one filter device according to claim 36.

52. An RF front-end device, comprising a multiplexing device, wherein the multiplexing device comprises at least one filter device according to claim 37.

* * * * *